United States Patent
Rice et al.

(10) Patent No.: US 7,293,642 B2
(45) Date of Patent: Nov. 13, 2007

(54) METHODS AND APPARATUS FOR TRANSPORTING SUBSTRATE CARRIERS

(75) Inventors: Michael R. Rice, Pleasanton, CA (US); Robert B. Lowrance, Los Gatos, CA (US); Martin R. Elliott, Round Rock, TX (US); Jeffrey C. Hudgens, San Francisco, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/476,994

(22) Filed: Jun. 27, 2006

(65) Prior Publication Data

US 2006/0243565 A1 Nov. 2, 2006

Related U.S. Application Data

(62) Division of application No. 10/764,982, filed on Jan. 26, 2004, now Pat. No. 7,077,264.

(60) Provisional application No. 60/443,087, filed on Jan. 27, 2003.

(51) Int. Cl.
*B65G 17/02* (2006.01)

(52) U.S. Cl. ............... 198/846; 198/844.1; 414/935

(58) Field of Classification Search .......... 198/846, 198/844.1, 847, 850, 465.1, 465.2, 465.3, 198/465.4; 414/395, 941
See application file for complete search history.

(56) References Cited

U.S. PATENT DOCUMENTS

| | | |
|---|---|---|
| 2,157,283 A | 5/1939 | Dyson |
| 2,268,542 A | 1/1942 | Bergmann |
| 2,689,638 A | 9/1954 | Mojonnier |
| 3,664,491 A | 5/1972 | Scanion et al. |
| 3,682,295 A | 8/1972 | Roinestad |
| 3,710,921 A | 1/1973 | Petiet |
| 3,710,923 A | 1/1973 | Frommet et al. |
| 3,722,656 A | 3/1973 | Loomis, Jr. et al. |
| 3,730,331 A | 5/1973 | Goldberg |

(Continued)

FOREIGN PATENT DOCUMENTS

EP 0 277 536 8/1988

(Continued)

OTHER PUBLICATIONS

Virvalo, T.K., "Cylinder Speed Synchronization", Dec. 1978, Hydraulics and Pneumatics, vol. 31, No. 12, pp. 55-57.

(Continued)

*Primary Examiner*—Mark A Deuble
(74) *Attorney, Agent, or Firm*—Dugan & Dugan

(57) ABSTRACT

According to a first aspect, a first conveyor system is provided that is adapted to deliver substrate carriers within a semiconductor device manufacturing facility. The first conveyor system includes a ribbon that forms a closed loop along at least a portion of the semiconductor device manufacturing facility. The ribbon is adapted to (1) be flexible in a horizontal plane and rigid in a vertical plane; and (2) transport a plurality of substrate carriers within at least a portion of the semiconductor device manufacturing facility. Numerous other aspects are provided, as are systems, methods and computer program products in accordance with these and other aspects.

31 Claims, 27 Drawing Sheets

U.S. PATENT DOCUMENTS

| | | | |
|---|---|---|---|
| 3,734,263 A | | 5/1973 | Dirks |
| 3,737,024 A | * | 6/1973 | Gelzer ........................ 198/725 |
| 3,788,455 A | | 1/1974 | Dieckmann |
| 3,815,723 A | | 6/1974 | Wright et al. |
| 3,865,229 A | | 2/1975 | Velander |
| 3,901,376 A | | 8/1975 | Dardaine et al. |
| 3,967,721 A | | 7/1976 | Rhoden |
| 3,990,569 A | | 11/1976 | Aiuola |
| 4,006,813 A | | 2/1977 | Fluck |
| 4,029,194 A | | 6/1977 | Feurstein et al. |
| 4,033,403 A | | 7/1977 | Seaton et al. |
| 4,040,302 A | | 8/1977 | Katarao |
| 4,044,886 A | | 8/1977 | Sender |
| 4,084,687 A | | 4/1978 | Lapeyre |
| 4,166,527 A | | 9/1979 | Beezer |
| 4,222,479 A | | 9/1980 | Dugan et al. |
| 4,261,236 A | | 4/1981 | Verjux |
| 4,266,652 A | | 5/1981 | Bald |
| 4,294,344 A | | 10/1981 | van Maanen |
| 4,340,137 A | | 7/1982 | Foster |
| 4,394,901 A | | 7/1983 | Roinestad |
| 4,401,522 A | | 8/1983 | Buschow et al. |
| 4,450,950 A | | 5/1984 | Foote, Jr. |
| 4,506,779 A | | 3/1985 | Seragnoli |
| 4,524,858 A | | 6/1985 | Maxey |
| 4,534,843 A | * | 8/1985 | Johnson et al. ............. 204/202 |
| 4,538,720 A | | 9/1985 | Limousin |
| 4,540,088 A | | 9/1985 | Bergh |
| 4,549,647 A | | 10/1985 | Cosse |
| 4,552,261 A | | 11/1985 | Raudat et al. |
| 4,584,944 A | | 4/1986 | Dehne |
| 4,585,126 A | | 4/1986 | Paddock et al. |
| 4,603,770 A | | 8/1986 | Hartness |
| 4,650,264 A | | 3/1987 | Dahnert |
| 4,653,630 A | | 3/1987 | Bravin |
| 4,667,809 A | | 5/1987 | Raybuck |
| 4,679,685 A | | 7/1987 | Inoko |
| 4,680,919 A | | 7/1987 | Hirama et al. |
| 4,693,359 A | | 9/1987 | Mattei et al. |
| 4,702,365 A | | 10/1987 | Pak |
| 4,708,727 A | | 11/1987 | Cardenas-Franco et al. |
| 4,711,346 A | * | 12/1987 | Breher et al. ................ 198/850 |
| 4,720,006 A | | 1/1988 | Lenherr |
| 4,750,605 A | | 6/1988 | Brems et al. |
| 4,759,439 A | | 7/1988 | Hartlepp |
| 4,765,453 A | | 8/1988 | Bucher |
| 4,775,046 A | * | 10/1988 | Gramarossa et al. ..... 198/803.8 |
| 4,813,528 A | | 3/1989 | Hartlepp |
| 4,830,180 A | | 5/1989 | Ferguson et al. |
| 4,850,102 A | | 7/1989 | Hironaka et al. |
| 4,852,717 A | | 8/1989 | Ross et al. |
| 4,854,440 A | | 8/1989 | Laube et al. |
| 4,869,637 A | | 9/1989 | deGroot |
| 4,898,373 A | | 2/1990 | Newsome |
| 4,901,843 A | | 2/1990 | Lashyro |
| 4,921,092 A | | 5/1990 | Crawford et al. |
| 5,048,164 A | | 9/1991 | Harima |
| 5,052,544 A | | 10/1991 | Anderson |
| 5,086,909 A | | 2/1992 | Powell, Jr. |
| 5,092,450 A | | 3/1992 | Schommartz et al. |
| 5,099,896 A | | 3/1992 | Ritola |
| 5,110,249 A | | 5/1992 | Norman |
| 5,113,992 A | | 5/1992 | Sadamori |
| 5,123,518 A | | 6/1992 | Pfaff |
| 5,135,102 A | | 8/1992 | Sjogren et al. |
| 5,184,712 A | | 2/1993 | Leypold et al. |
| 5,207,309 A | | 5/1993 | Simpkin et al. |
| 5,226,211 A | | 7/1993 | Jones |
| 5,231,926 A | | 8/1993 | Williams et al. |
| 5,261,935 A | | 11/1993 | Ishii et al. |
| 5,269,119 A | | 12/1993 | Tolson |
| 5,275,275 A | | 1/1994 | Boldrini et al. |
| 5,303,818 A | | 4/1994 | Gruettner et al. |
| 5,339,938 A | * | 8/1994 | Patin ........................ 198/334 |
| 5,341,915 A | | 8/1994 | Cordia et al. |
| 5,377,819 A | | 1/1995 | Horton et al. |
| 5,439,091 A | | 8/1995 | Mason |
| 5,549,195 A | | 8/1996 | Aulagner et al. |
| 5,558,198 A | | 9/1996 | Juarez |
| 5,560,471 A | | 10/1996 | Prochut et al. |
| 5,573,106 A | | 11/1996 | Stebnicki |
| 5,603,777 A | | 2/1997 | Ohashi |
| 5,617,944 A | | 4/1997 | McTaggart |
| 5,628,614 A | | 5/1997 | Pazdernik et al. |
| 5,653,327 A | | 8/1997 | Buday, Jr. et al. |
| 5,664,254 A | | 9/1997 | Ohkura et al. |
| 5,667,056 A | | 9/1997 | Kimmet |
| 5,762,544 A | | 6/1998 | Zuniga et al. |
| 5,782,338 A | | 7/1998 | Schuster et al. |
| 5,797,249 A | | 8/1998 | Hartness |
| 5,823,319 A | | 10/1998 | Resnick et al. |
| 5,827,118 A | | 10/1998 | Johnson et al. |
| 5,829,574 A | | 11/1998 | DelSanto |
| 5,829,939 A | | 11/1998 | Iwai et al. |
| 5,865,292 A | | 2/1999 | Aguilar et al. |
| 5,887,701 A | | 3/1999 | Spatafora |
| 5,980,183 A | | 11/1999 | Fosnight |
| 5,996,776 A | | 12/1999 | van Zijderveld |
| 6,036,426 A | | 3/2000 | Hillman |
| 6,054,181 A | | 4/2000 | Nanbu et al. |
| 6,092,979 A | | 7/2000 | Miselli |
| 6,171,672 B1 | | 1/2001 | Koike et al. |
| 6,183,186 B1 | | 2/2001 | Peltola et al. |
| 6,209,710 B1 | | 4/2001 | Mueller et al. |
| 6,223,887 B1 | | 5/2001 | Andou |
| 6,227,345 B1 | | 5/2001 | Miyamoto |
| 6,227,346 B1 | | 5/2001 | Lecomte et al. |
| 6,227,348 B1 | | 5/2001 | Frei et al. |
| 6,234,300 B1 | | 5/2001 | De Vos et al. |
| 6,235,634 B1 | | 5/2001 | Law et al. |
| 6,283,692 B1 | | 9/2001 | Perlov et al. |
| 6,431,347 B1 | * | 8/2002 | Gossner .................. 198/687.1 |
| 6,435,331 B1 | | 8/2002 | Olson et al. |
| 6,439,822 B1 | | 8/2002 | Kimura et al. |
| 6,511,065 B1 | | 1/2003 | Cote et al. |
| 6,579,052 B1 | | 6/2003 | Bonora et al. |
| 6,581,750 B1 | | 6/2003 | Tweedy et al. |
| 6,607,073 B2 | * | 8/2003 | Buchi et al. ................ 198/805 |
| 7,051,870 B2 | * | 5/2006 | Schoendienst et al. ....... 198/850 |
| 2002/0090282 A1 | | 7/2002 | Bachrach |
| 2003/0010449 A1 | | 1/2003 | Gramarossa et al. |
| 2003/0173191 A1 | | 9/2003 | Hammock et al. |

FOREIGN PATENT DOCUMENTS

| | | |
|---|---|---|
| EP | 0 582 019 A1 | 2/1994 |
| EP | 0717717 B1 | 7/1999 |
| EP | 00735927 B1 | 11/1999 |
| EP | 0 987 750 A1 | 3/2000 |
| EP | 00912426 B1 | 8/2000 |
| EP | 1 134 641 A1 | 9/2001 |
| EP | 1 445 794 A2 | 1/2004 |
| JP | 63020151 A2 | 1/1988 |
| JP | 02098157 A | 4/1990 |
| JP | 03132691 A | 6/1991 |
| JP | 10-256346 | 9/1998 |
| JP | 00062949 A | 2/2000 |
| JP | 00335799 A | 12/2000 |
| JP | 2003072835 A | 3/2003 |
| WO | WO 97/09256 A1 | 3/1997 |

| | | |
|---|---|---|
| WO | WO 99/64207 | 12/1999 |
| WO | WO 00/69724 A1 | 11/2000 |
| WO | WO 01/73678 A | 10/2001 |
| WO | WO 02/19392 A1 | 3/2002 |

OTHER PUBLICATIONS

Cheng, et al., "Adaptive Synchronization Control of a Robotic Manipulator Operating in an Intelligent Workcell", Apr. 1990, IEEE Transactions on Industrial Electronics, vol. 37, No. 2, pp. 119-126.

Shih-Hung Li, et al. "An Ultrahigh Speed Assembly Robot System, Part L Design", 1994, Proceedings 1994 Japan-U.S.A. Symposium on Flexible Automation—A Pacific Rim Conference, vol. 2, pp. 465-472.

Roberts, et al., "Feed Chute Geometry for Minimum Belt Wear", Sep. 1998, 6th International Conference on Bulk Materials Storage, Handling and Transportation, pp. 153-159.

Saigo, et al., "Drive Control Systems for Processing Lines", Nov. 10, 2000, Fuji Jiho (Fuji Electric Journal), vol. 73, No. 11, pp. 45-49, Japanese language (Abstract only).

Saigo, K., "Variable-speed Drive Systems for Industrial Plants", Nov. 10, 2000, Fuji Jiho (Fuji Electric Journal), vol. 73, No. 11, pp. 10-14, Japanese language (Abstract only).

Park, et al., "Task Sequence Optimization for a Dual-Robot Assembly System using Evolutionary Algorithms", 2001, Proceedings of the Institution of Mechanical Engineers, Part B (Journal of Engineering Manufacture), vol. 215, No. B6, pp. 835-846.

* cited by examiner

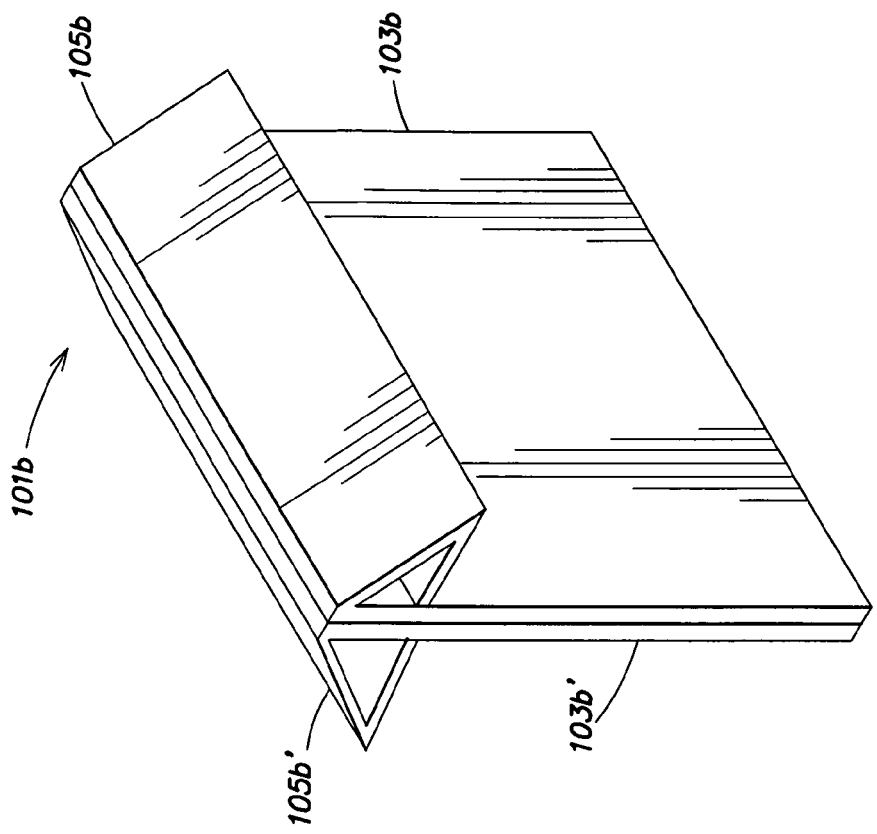
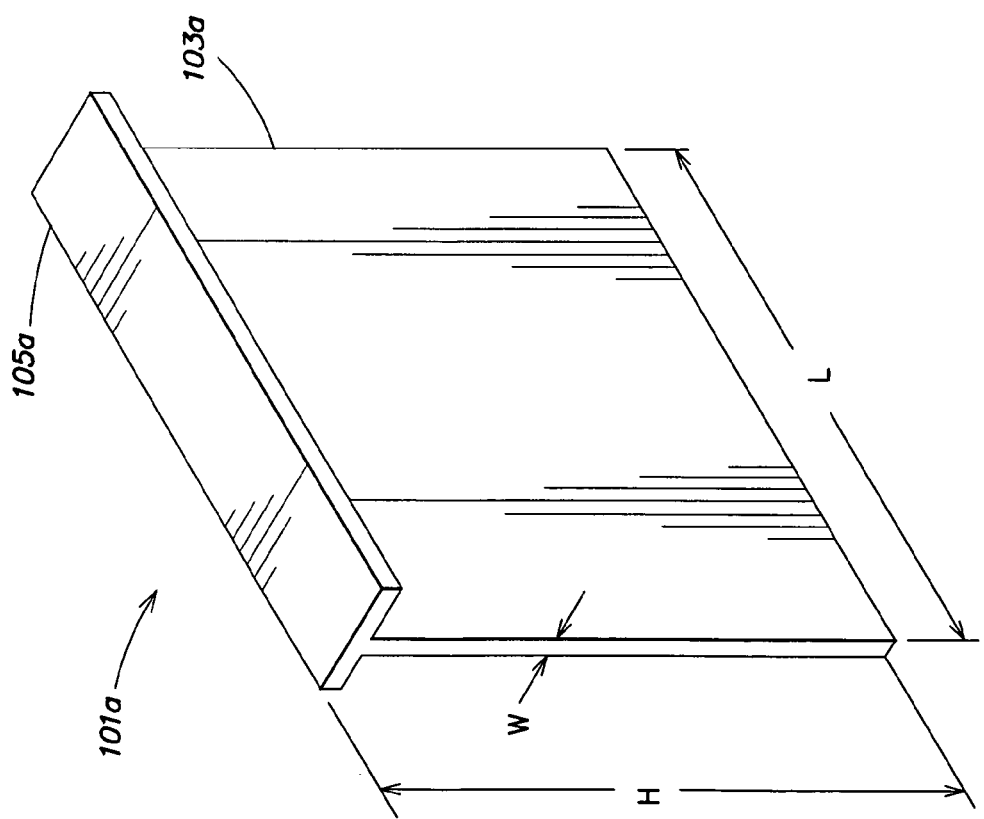

METHODS AND APPARATUS FOR TRANSPORTING SUBSTRATE CARRIERS

The present application is a division of and claims priority from U.S. patent application Ser. No. 10/764,982 filed Jan. 26, 2004, now U.S. Pat. No. 7,077,264 which claims priority from U.S. Provisional Patent Application Ser. No. 60/443,087, filed Jan. 27, 2003. Both of these patent applications are incorporated by reference herein in their entirety.

FIELD OF THE INVENTION

The present invention relates generally to semiconductor device fabrication systems, and is more particularly concerned with transportation of substrate carriers within a fabrication facility.

CROSS REFERENCE TO RELATED APPLICATIONS

The present application is related to the following commonly-assigned, co-pending U.S. patent applications, each of which is hereby incorporated by reference herein in its entirety:

U.S. patent application Ser. No. 10/650,310, filed Aug. 28, 2003 and titled "System For Transporting Substrate Carriers";

U.S. patent application Ser. No. 10/650,312, filed Aug. 28, 2003 and titled "Method and Apparatus for Using Substrate Carrier Movement to Actuate Substrate Carrier Door Opening/Closing";

U.S. patent application Ser. No. 10/650,481, filed Aug. 28, 2003 and titled "Method and Apparatus for Unloading Substrate Carriers from Substrate Carrier Transport Systems";

U.S. patent application Ser. No. 10/650,479, filed Aug. 28, 2003 and titled "Method and Apparatus for Supplying Substrates to a Processing Tool";

U.S. patent application Ser. No. 60/407,452, filed Aug. 31, 2002 and titled "End Effector Having Mechanism For Reorienting A Wafer Carrier Between Vertical And Horizontal Orientations";

U.S. patent application Ser. No. 60/407,337, filed Aug. 31, 2002, and titled "Wafer Loading Station with Docking Grippers at Docking Stations";

U.S. patent application Ser. No. 10/650,311, filed Aug. 28, 2003 and titled "Substrate Carrier Door having Door Latching and Substrate Clamping Mechanism";

U.S. patent application Ser. No. 10/650,480, filed Aug. 28, 2003 and titled "Substrate Carrier Handler That Unloads Substrate Carriers Directly From a Moving Conveyor";

U.S. Provisional Application Ser. No. 60/443,153, filed Jan. 27, 2003, and titled "Overhead Transfer Flange and Support for Suspending Wafer Carrier";

U.S. Provisional Application Ser. No. 60/443,001, filed Jan. 27, 2003, and titled "Systems and Methods for Transporting Wafer Carriers Between Processing Tools"; and U.S. Provisional Application Ser. No. 60/443,115, filed Jan. 27, 2003, and titled "Apparatus and Method for Storing and Loading Wafer Carriers".

BACKGROUND OF THE INVENTION

Manufacturing of semiconductor devices typically involves performing a sequence of procedures with respect to a substrate such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

For an individual substrate, the total fabrication process, from formation or receipt of the virgin substrate to cutting of semiconductor devices from the finished substrate, may require an elapsed time that is measured in weeks or months. In a typical fabrication facility, a large number of substrates may accordingly be present at any given time as "work in progress" (WIP). The substrates present in the fabrication facility as WIP may represent a large investment of working capital, which tends to increase the per substrate manufacturing cost. It would therefore be desirable to reduce the amount of WIP for a given substrate throughput for the fabrication facility. To do so, the total elapsed time for processing each substrate should be reduced.

Previously incorporated U.S. patent application Ser. No. 10/650,310, filed Aug. 28, 2003, entitled "System for Transporting Semiconductor Substrate Carriers", discloses a substrate carrier transport system that includes a conveyor for substrate carriers that is intended to be constantly in motion during operation of the fabrication facility which it serves. The constantly moving conveyor may facilitate transportation of substrates within the fabrication facility so as to reduce the total "dwell" time of each substrate in the fabrication facility; thereby reducing WIP, and cutting capital and manufacturing costs. Improved designs and methods of operation for such conveyors would be desirable.

SUMMARY OF THE INVENTION

According to a first aspect of the invention, a first conveyor system is provided that is adapted to deliver substrate carriers within a semiconductor device manufacturing facility. The first conveyor system includes a ribbon that forms a closed loop along at least a portion of the semiconductor device manufacturing facility. The ribbon is adapted to (1) be flexible in a horizontal plane and rigid in a vertical plane; and (2) transport a plurality of substrate carriers within at least a portion of the semiconductor device manufacturing facility.

In a second aspect of the invention, a second conveyor system is provided that is similar to the first conveyor system. In addition to the features of the first conveyor system, in the second conveyor system, the ribbon is adapted to continuously rotate; and a plurality of supports are rigidly coupled to the ribbon. Each support is adapted to support and transport a substrate carrier within at least a portion of the semiconductor device manufacturing facility. The second conveyor system also includes (1) one or more driving wheels adapted to contact the ribbon and to rotate the ribbon; (2) one or more constraining wheels adapted to contact the ribbon and to reduce lateral motion of the ribbon as it rotates; and (3) one or more support wheels adapted to support the ribbon as the ribbon rotates. The one or more driving wheels, the one or more constraining wheels and the one or more support wheels are each adapted to be changed while the ribbon is in motion. Numerous other aspects are provided, as are systems, methods and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

The methods and apparatus of the present invention provide for an efficient and reliable arrangement for transporting substrate carriers within one or more semiconductor device manufacturing facilities.

Other features and aspects of the present invention will become more fully apparent from the following detailed description of exemplary embodiments, the appended claims and the accompanying drawings.

BRIEF DESCRIPTION OF THE DRAWINGS

FIGS. 1A and 1B are exemplary perspective views of a portion of respective first and second exemplary ribbons of a conveyor configured in accordance with the present invention.

DETAILED DESCRIPTION

Figure 2:
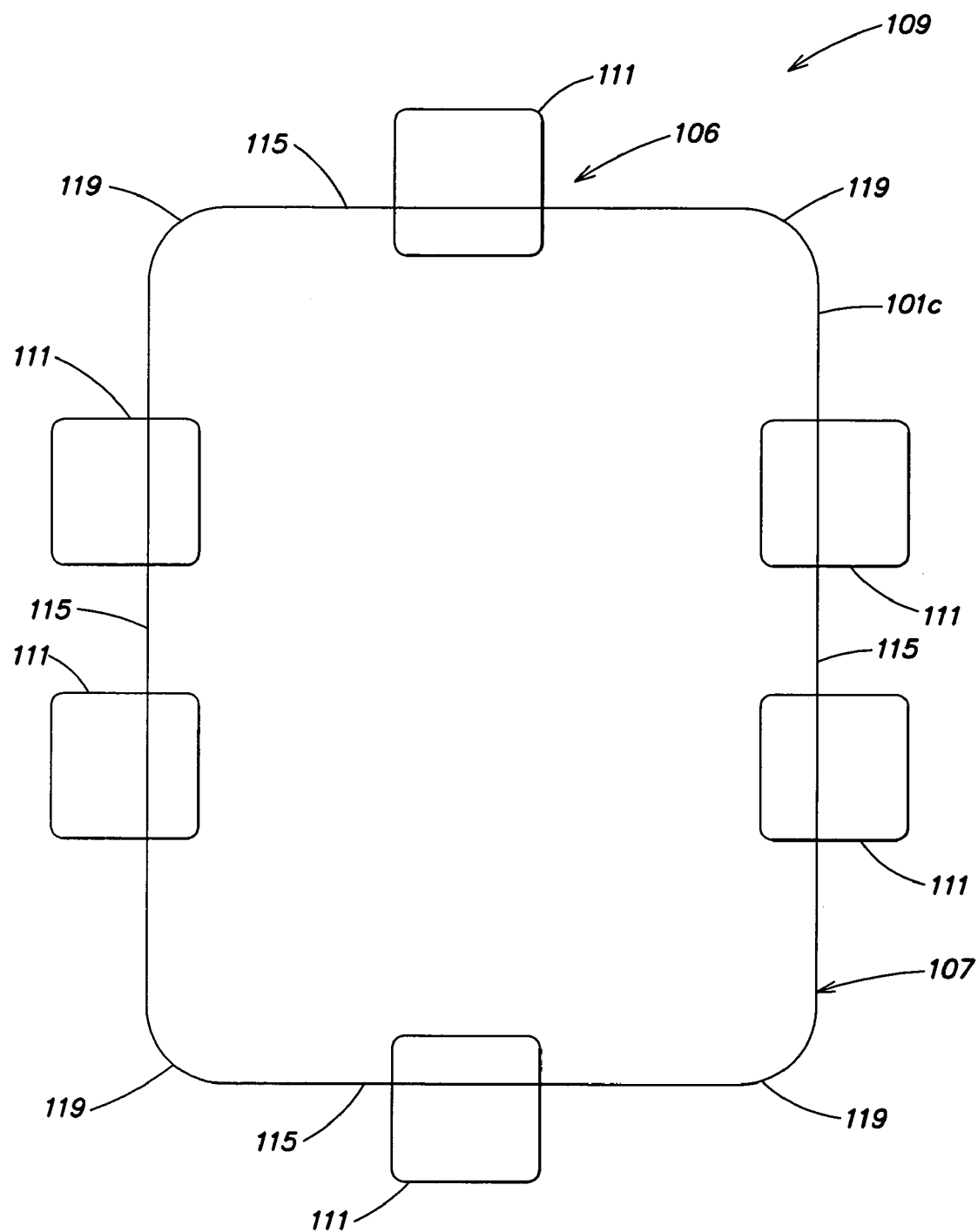
FIG. 2 is a schematic view of a conveyor system comprising a ribbon in accordance with the present invention that forms a simple loop within a portion of a semiconductor device manufacturing facility.

In accordance with at least one aspect of the invention, an inventive conveyor system is provided for transporting substrate carriers between one or more processing tools of a semiconductor device manufacturing facility. The inventive conveyor system may include a ribbon of stainless steel or a similar material that forms a closed loop within at least a portion of the semiconductor device manufacturing facility and that transports substrate carriers therein. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the inventive conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

In one or more embodiments of the invention, the ribbon of the conveyor system is rotated or "driven" using one or more driving wheels or another driving mechanism, and the ribbon is supported using one or more supporting wheels or another supporting mechanism. For example, the driving wheels may contact and drive the ribbon along a vertical portion of the ribbon, and the supporting wheels may contact and support the ribbon along a horizontal portion of the ribbon. In this manner, the driving mechanism for the ribbon is decoupled from the supporting mechanism for the ribbon and each may be serviced independently. In one particular embodiment, each driving wheel and/or supporting wheel of the inventive conveyor system may be replaced while the ribbon is in motion (e.g., allowing the ribbon to be continuously rotated as described further below). One or more constraining wheels or another constraining mechanism may be employed to laterally stabilize and/or otherwise reduce lateral motion of the ribbon during rotation. As with the driving wheels and supporting wheels, in at least one embodiment of the invention, each constraining wheel may be replaced while the ribbon is in motion. Numerous other embodiments and/or aspects of the invention are described below with reference to FIGS. 1A-23.

As used herein, a ribbon refers to a structure at least a portion of which is generally flat (e.g., has a height and/or length that is significantly larger than its width). A ribbon may be formed from one or more materials and/or one or more pieces. For example, FIGS. 1A and 1B are exemplary perspective views of a portion of a first ribbon 101a and a second ribbon 101b, respectively, of a conveyor (not separately shown) configured in accordance with the present invention. As shown in FIG. 1A, the first ribbon 101a may be formed from a single piece of material, and/or may include both a ribbon-like, vertical portion 103a for supporting substrate carriers and a horizontal portion 105a for supporting the first ribbon 101a (as described further below). The vertical portion 103a of the first ribbon 101a has a height H and length L that are significantly larger than the width W of the first ribbon 101a. Likewise, as shown in FIG. 1B, the second ribbon 101b may be formed from more than one piece. For example, the second ribbon 101b includes a first vertical portion 103b and a second vertical portion 103b', and a first horizontal portion 105b and a second horizontal portion 105b'. Although the cross-sectional shapes of the horizontal portions of ribbons 101a and 101b are shown as being flat and triangular, respectively, it will be understood that other shapes may be employed for the horizontal portion or portions of a ribbon in accordance with the present invention.

Exemplary Conveyor Systems

FIG. 2 is a schematic view of a first exemplary conveyor system 106 comprising a ribbon 101c provided in accordance with the present invention that forms a simple loop 107 within a portion of a semiconductor device manufacturing facility 109. The ribbon 101c may comprise, for example, any of the inventive ribbons described herein. The ribbon 101c transports substrate carriers (not shown) between processing tools 111, and comprises straight portions 115 and curved portions 119 to form the (closed) loop 107.

Figure 3:
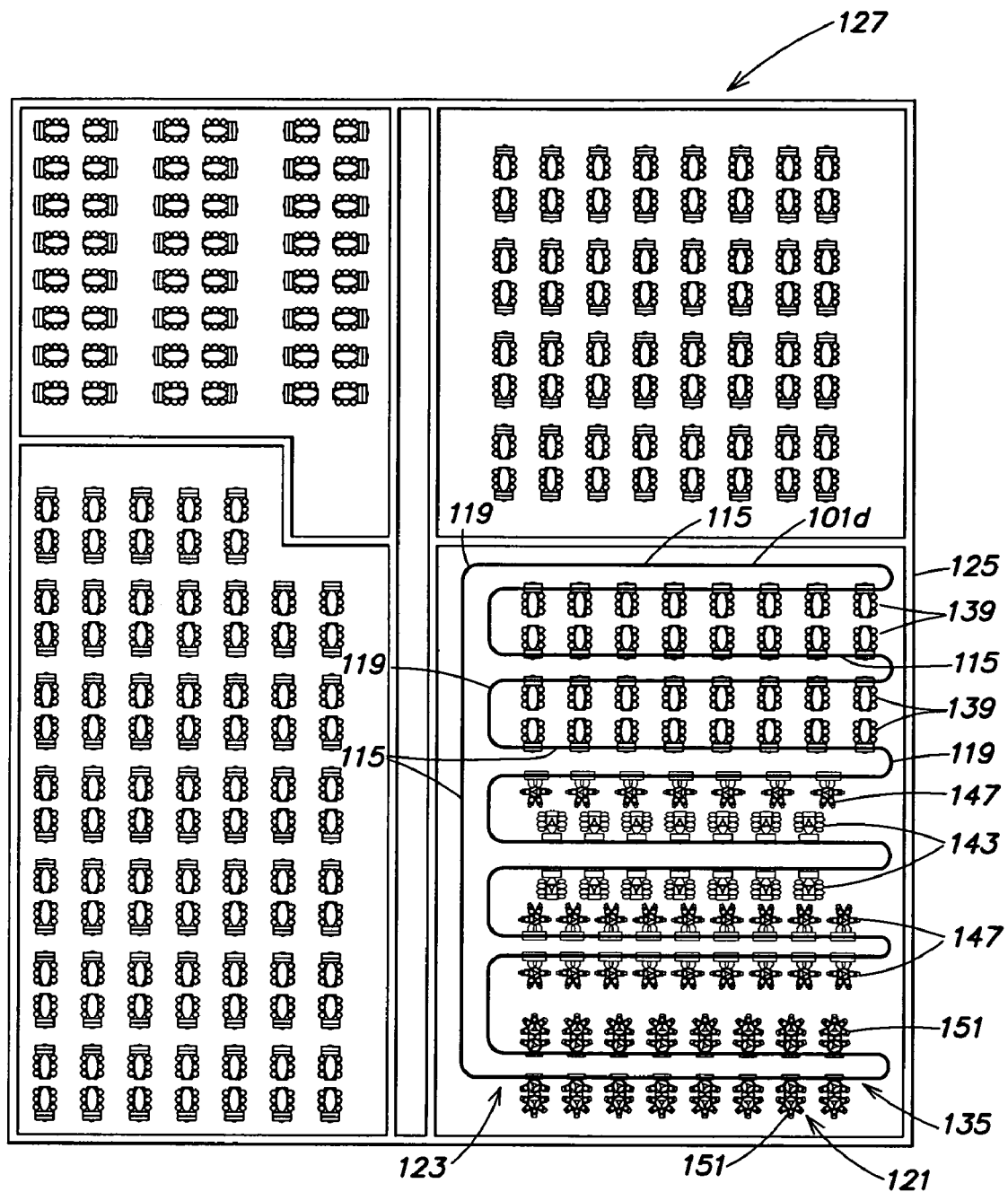
FIG. 3 is a schematic view of a conveyor system comprising a ribbon in accordance with the present invention that forms a serpentine loop in a portion of a semiconductor manufacturing facility.

FIG. 3 is a schematic view of a second exemplary conveyor system 121 comprising a ribbon 101d provided in accordance with the present invention that forms a serpentine loop 123 in a portion 125 of a semiconductor device manufacturing facility 127. The ribbon 101d transports substrate carriers (not shown) between substrate loading stations 135 of a plurality of processing tools, such as processing tools 139, 143, 147 and 151. As shown in FIG. 3, ribbon 101d comprises numerous straight portions 115 and curved portions 119 (all of which are not labeled in FIG. 3) to form the serpentine (closed) loop 123. The ribbon 101d may be similar to the ribbon 101c of FIG. 3.

Each substrate loading station 135 may comprise, for example, any suitable apparatus adapted to (1) receive a substrate carrier from the conveyor system 121; (2) unload a substrate from the substrate carrier; and/or (3) deliver the substrate to the processing tool coupled to the substrate loading station 135. One exemplary substrate loading station that may be employed is described in previously incorporated U.S. Patent Provisional Application Ser. No. 60/407,337, filed Aug. 31, 2002, although other substrate loading stations may be employed. Each substrate loading station 135 may be coupled to a processing tool and/or comprise a load lock, factory interface or the like.

Figure 4:
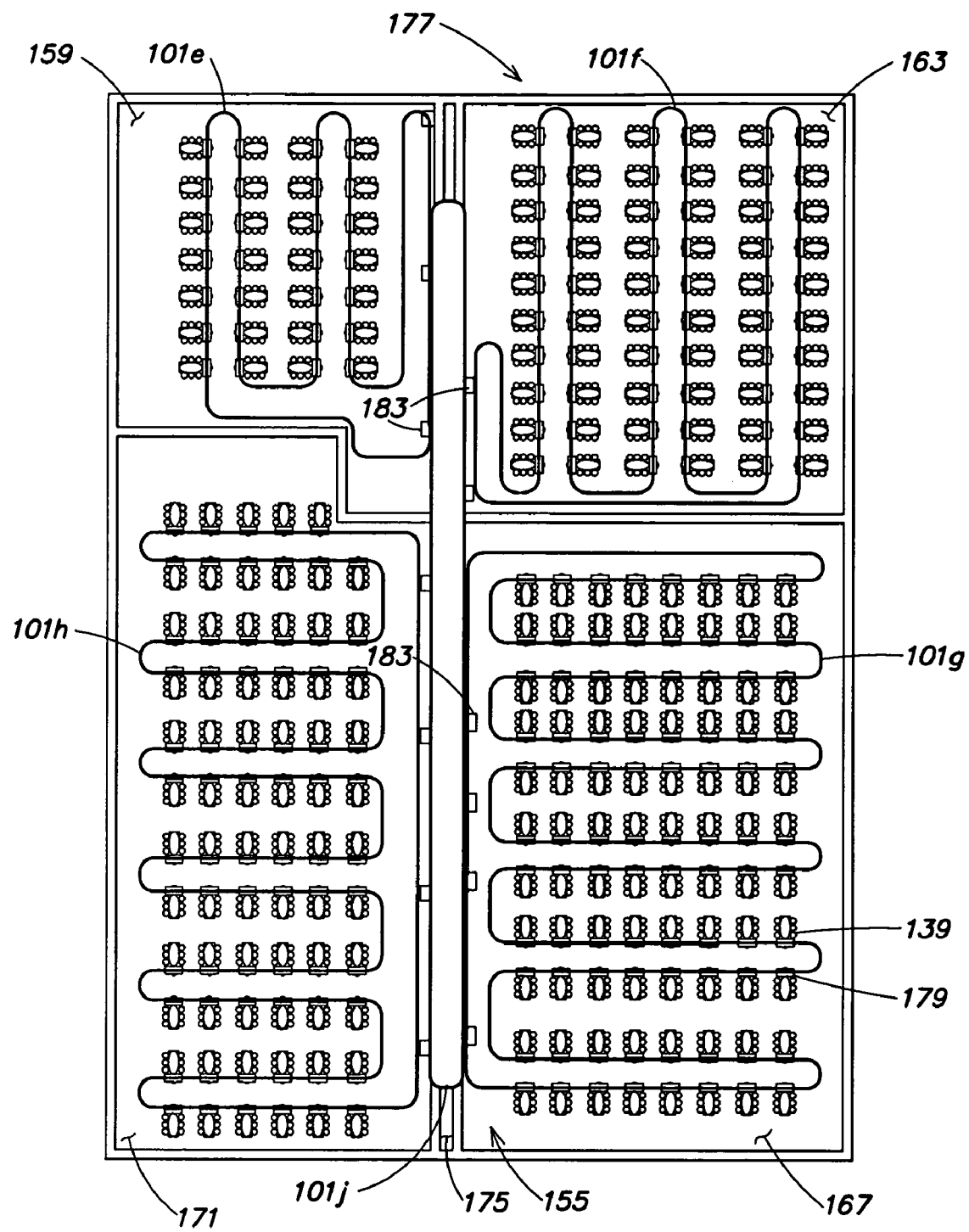
FIG. 4 is a schematic view of a conveyor system comprising ribbons in accordance with the present invention that form simple and serpentine loops in portions of a semiconductor device manufacturing facility.

FIG. 4 is a schematic view of a third exemplary conveyor system 155 comprising ribbons 101e, 101f, 101g, 101h and 101j provided in accordance with the present invention that form simple and serpentine closed loops in respective portions 159, 163, 167, 171 and 175 of a semiconductor device manufacturing facility 177. Ribbons 101e, 101f, 101g and 101h transport substrate carriers (not shown) between substrate loading stations 179 of processing tools 139. Ribbon 101j transports substrate carriers (not shown) between ribbons 101e, 101f, 101g and 101h. At the respective interfaces between ribbon 101j and ribbons 101e, 101f, 101g and 101h, transfer mechanisms 183 are provided for transferring substrate carriers (not shown) from one ribbon to another and vice versa. Fewer or more transfer mechanisms than shown may be employed. Ribbons 101e, 101f, 101g, 101h and 101j all contain straight portions and curved portions and form closed loops, but only ribbons 101e, 101f, 101g and 101h form serpentine loops. Other loop configurations may be employed. The ribbons 101e-j may comprise, for example, any of the inventive ribbons described herein.

Exemplary Inventive Ribbons

Figure 5:
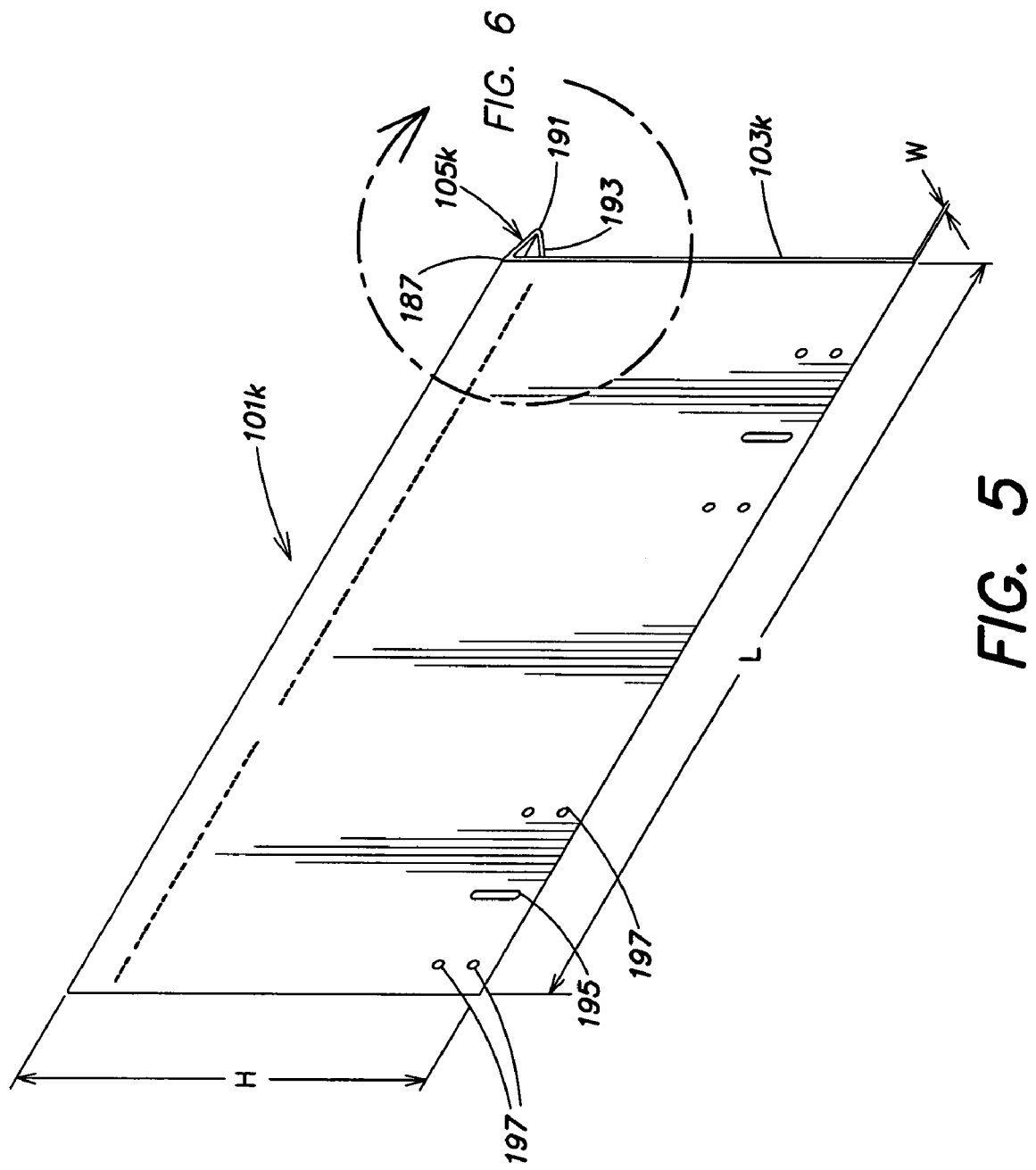
FIG. 5 is a perspective view of a third exemplary ribbon in accordance with the present invention.

FIG. 5 is a perspective view of a third exemplary ribbon 101k provided in accordance with the present invention. Ribbon 101k (or at least the portion of ribbon 101k shown in FIG. 5) is formed from a continuous (single) piece of material. A vertical portion 103k of ribbon 101k has a narrow width W compared to a height H and a length L of the vertical portion 103k. A horizontal portion 105k of ribbon 101k is formed in part by bends 187 and 191 in the material of the ribbon 101k, and presents a horizontal surface 193 by which the weight of ribbon 101k may be supported. Surface indicia, such as vertically-oriented slots 195 and mounting features, such as holes 197, are provided on the vertical portion 103k of ribbon 101k, and are arranged at regular intervals along the length L of ribbon 101k to respectively (1) identify the location of substrate carriers being transported by the ribbon 101k (as described below); and (2) provide a secure and/or rigid mounting location for supports or cradles adapted to support substrate carriers being transported by the ribbon 101k (as described below). Other surface indicia may be employed to identify substrate carrier location (e.g., two or more slots per substrate carrier location, other indicia shapes, reflective surfaces, etc.). Likewise other mounting features may be employed for supporting substrate carriers.

Figure 6:
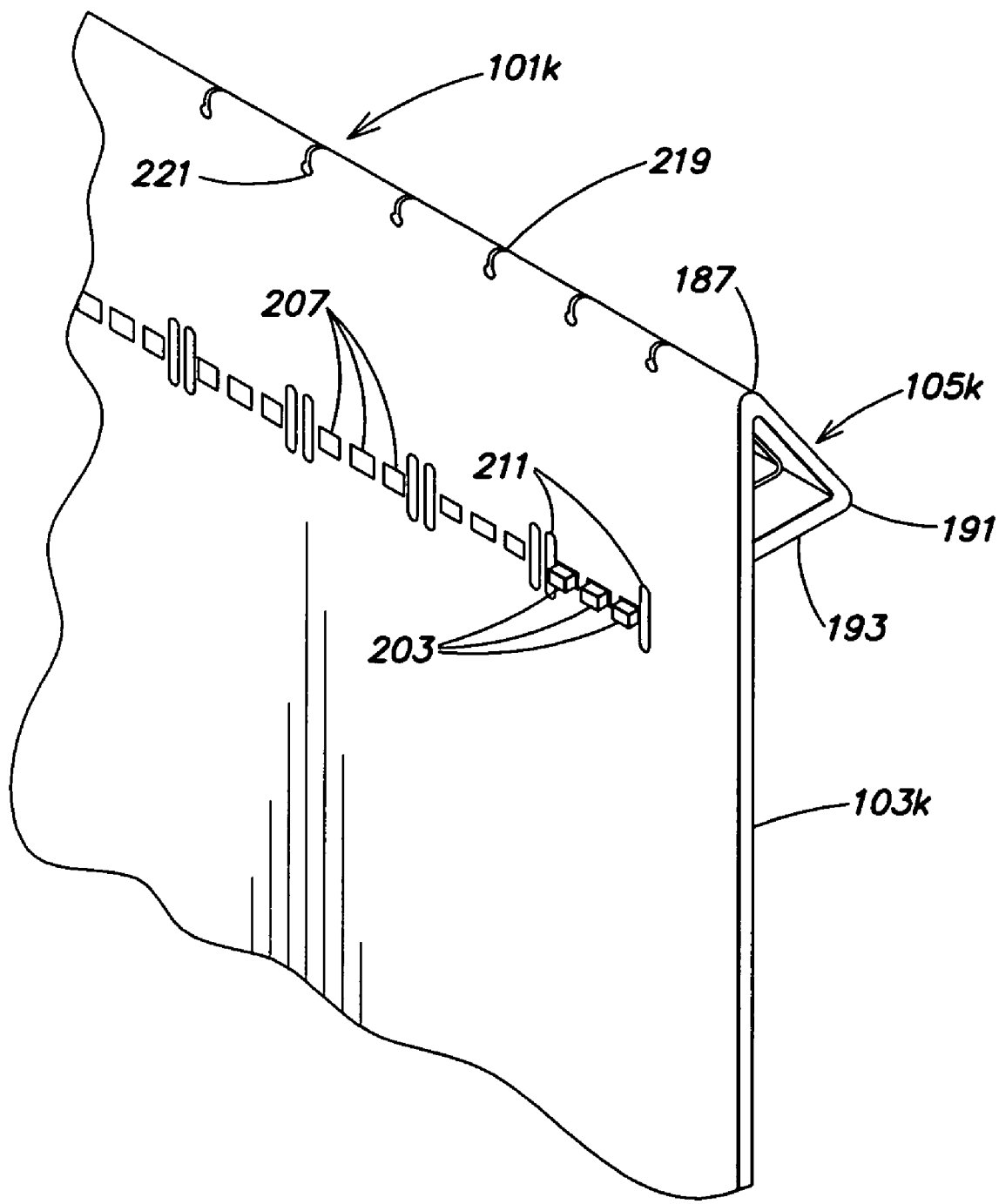
FIG. 6 is a close-up perspective view of the ribbon of FIG. 5.

FIG. 6 is a close-up perspective view of the ribbon 101k of FIG. 5 corresponding to circular window 199 of FIG. 5. As shown in FIG. 6, tabs 203 formed at the end of the ribbon 101k (near horizontal portion 105k) mate with and are inserted into insertion slots 207 formed in the vertical portion 103k of the ribbon 101k. Welds (not shown) are formed at the interface between the tabs 203 and insertion slots 207 to prevent the tabs 203 from backing out of the slots 207, and strain relief slots 211 are formed through the ribbon 101k next to the welds (not shown) to provide strain relief at the site of the welds. Other methods of attaching the horizontal portion 105k of the ribbon 101k to the vertical portion 103k of the ribbon 101k may be employed such as rivoted T sections.

Bending features such as bending slots 219 (e.g., laser or otherwise machined cuts) are formed through horizontal portion 105k, and strain-relief openings 221 are formed near bend 187 of horizontal portion 105k (adjacent bending slots 219) to relieve strain along bend 187 of the horizontal portion 105k when ribbon 101k bends and/or flexes in a horizontal plane (as described further below).

Figure 7:
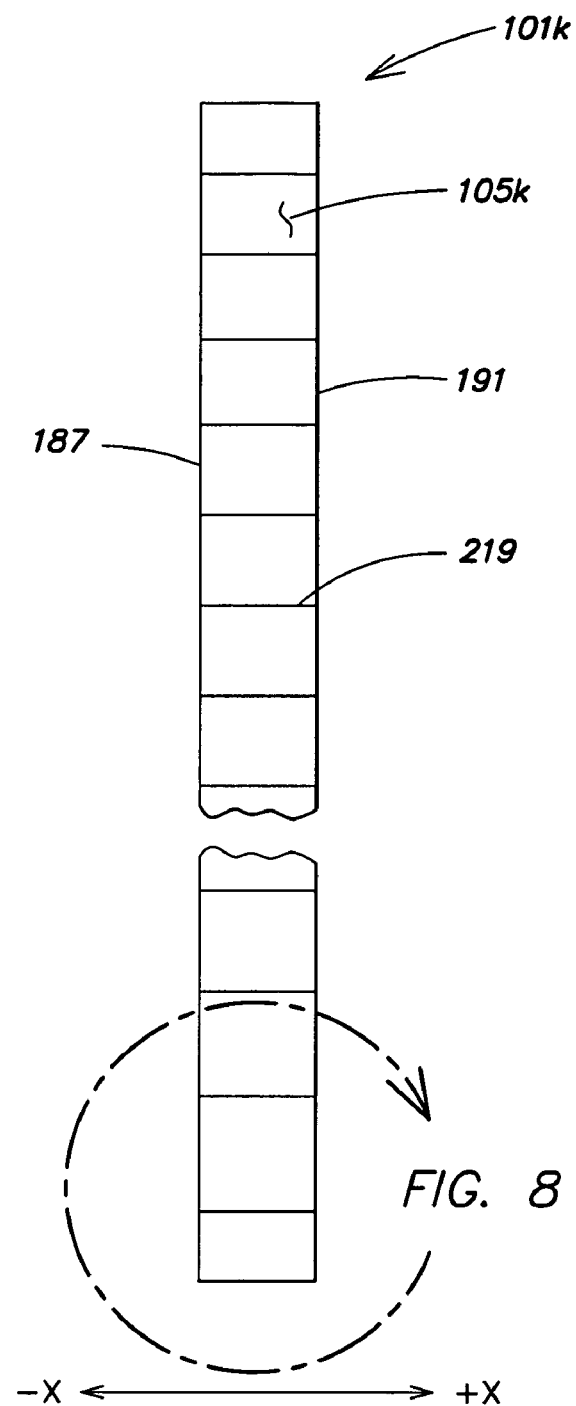
FIG. 7 is a top plan view of the ribbon of FIG. 5.
Figure 8:
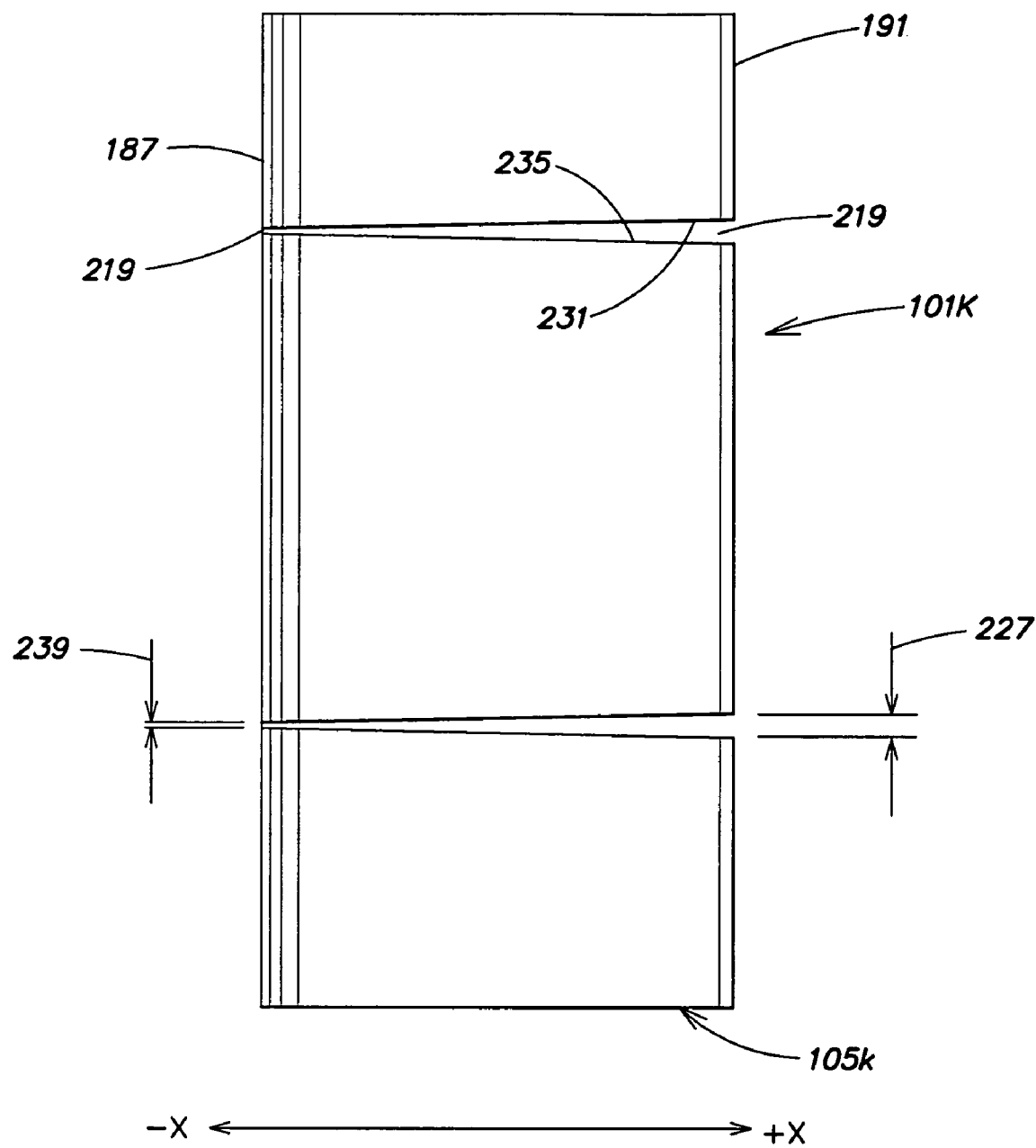
FIG. 8 is a close-up top plan view of the ribbon of FIGS. 5 and 7.

FIG. 7 is a top plan view of the ribbon 101k of FIGS. 5 and 6, and FIG. 8 is a close-up top plan view of the ribbon 101k of FIG. 7 corresponding to circular window 223 of FIG. 7. As shown in FIGS. 7 and 8, in at least one embodiment, the bending slots 219 through horizontal portion 105k of ribbon 101k are V-shaped and run perpendicular to bends 187 and 191 from the strain relief openings 221 (FIG. 6) located along bend 187. Because bending slots 219 pass all the way through horizontal portion 105k of ribbon 101k, nothing in the structure of the horizontal portion 105k of ribbon 101k will prevent ribbon 101k from bending or otherwise flexing in a horizontal plane perpendicular to the vertical portion 103k of the ribbon 101k (FIG. 6), such as in the +x and −x directions in FIGS. 7 and 8. However, if bending slots 219 were relatively narrow at bend 191, the extent to which ribbon 101k could bend in the +x direction would be much more limited. Due to the shape of bending slots 219 being roughly in the form of a "V", a gap 227 between edges 231 and 235 of bending slots 219 at bend 191 is proportionally much larger than the narrow gap 239 between edges 231 and 235 of bending slots 219 at bend 187. As such, a concave right bend as viewed in FIGS. 7 and 8 (e.g., a bend in the +x direction) is nearly as unrestrained as is a concave left bend (e.g., a bend in the −x direction). It will be understood that concave right bends are limited to bends that cause edges 231 and 235 of bending slots 219 to touch, eliminating gap 227 and provoking mechanical interference.

Other configurations for providing the horizontal portion 105k with lateral flexibility may be provided in place of or in addition to the V-shaped bending slots 219, such as uniform width bending slots or otherwise shaped slots or features. Exemplary dimensions and materials for the ribbon 101k are described below.

Figure 9:
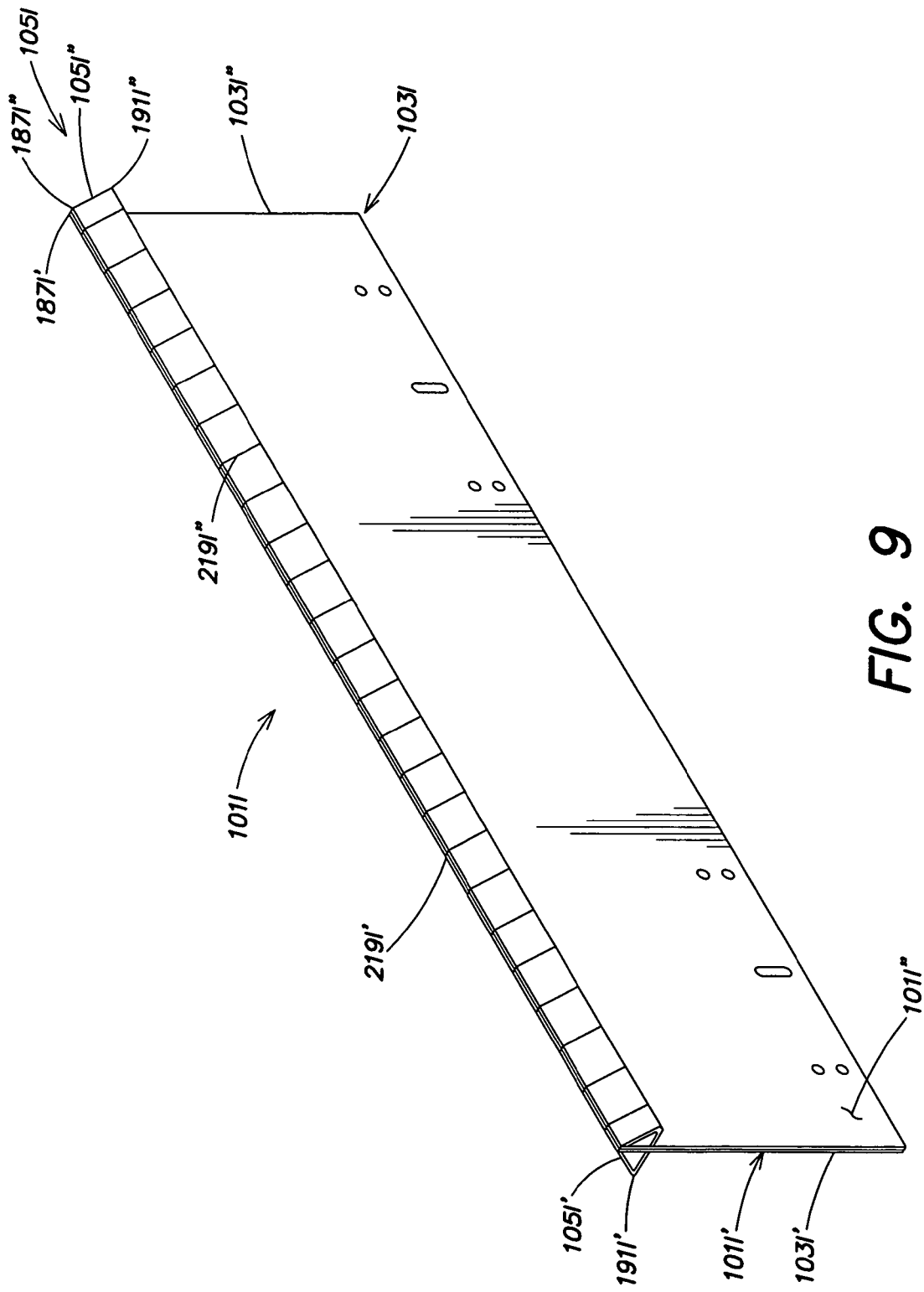
FIG. 9 is a perspective view of a fourth exemplary ribbon in accordance with the present invention comprising first and second ribbon sections coupled in parallel along their lengths.

FIG. 9 is a perspective view of a fourth exemplary ribbon 1011 comprising first and second ribbon sections 1011' and 1011" coupled in parallel along their lengths. With reference to FIG. 9, a horizontal portion 1051 of ribbon 1011 comprises first and second horizontal portions 1051' and 1051", and a vertical portion 1031 of ribbon 1011 comprises first and second vertical portions 1031' and 1031". First horizontal portion 1051' of first ribbon section 1011' includes bends 1871' and 1911', and bending features such as bending slots 2191', and second horizontal portion 1051" of second ribbon section 1011" includes bends 1871" and 1911", and bending features such as bending slots 2191".

Figure 10:
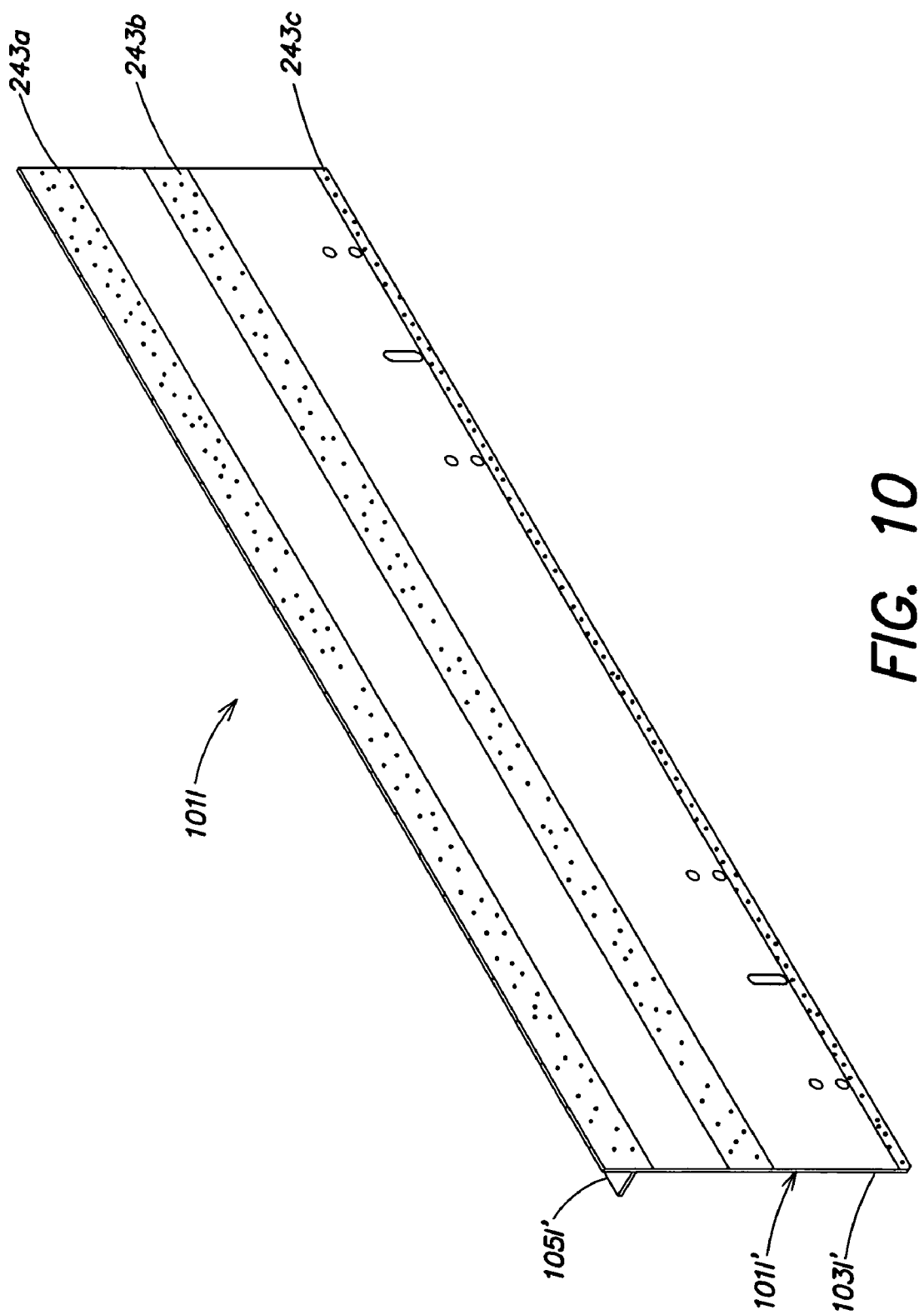
FIG. 10 is a perspective view of a portion of the inventive ribbon of FIG. 9, with a section removed to reveal adhesive strips running the length of the ribbon.

FIG. 10 is a perspective view of a portion of ribbon 1011 of FIG. 9, with second ribbon section 1011" removed to reveal adhesive strips 243a, 243b and 243c (e.g., two-sided tape) running the length of ribbon 1011. Adhesive strip 243a is placed along the top of ribbon 1011 adjacent horizontal portion 1051, and secures the first horizontal portion 1051' of first ribbon section 1011' to the second horizontal portion 1051" (FIG. 9) of second ribbon section 1011" (FIG. 9). Adhesive strip 243b is placed along the middle of ribbon 1011, and adhesive strip 243c is placed along the bottom of ribbon 1011. Together, adhesive strips 243b and 243c secure the first vertical portion 1031' of first ribbon section 1011' to the second vertical portion 1031" (FIG. 9) of second ribbon section 1011" (FIG. 9). Other locations for the adhesive strips 243a-b may be employed.

Each adhesive strips 243a-c may comprise, for example, one or more strips of high-strength, two-sided tape such as VHB tape manufactured by 3M, or another suitable adhesive strip. Other numbers of adhesive strips may be employed, as may other techniques for coupling the first and second ribbon sections 1011' and 1011" of the ribbon 1011 (e.g., welding, riveting, gluing or the like).

Figure 11:
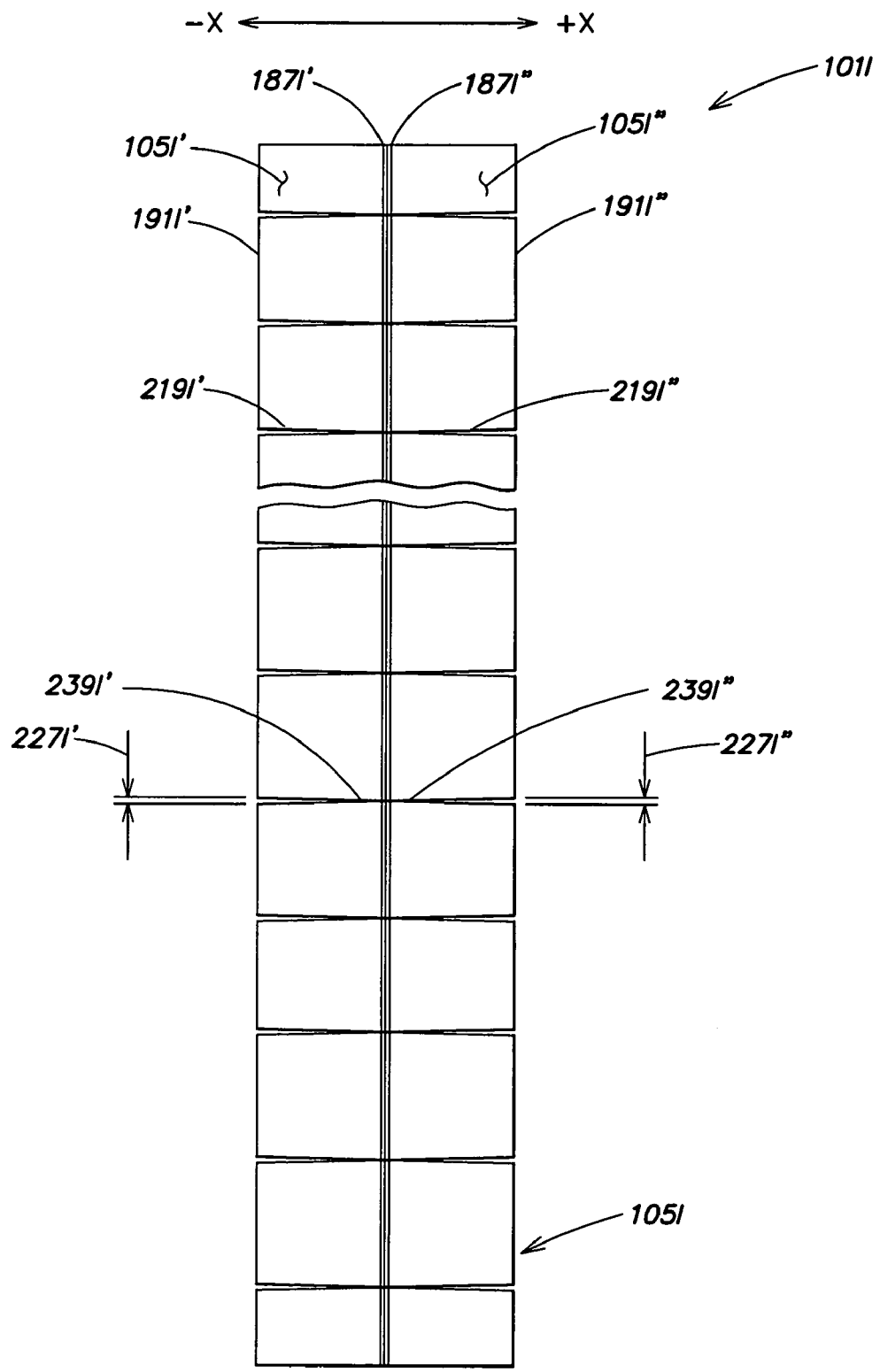
FIG. 11 is a top plan view of the inventive ribbon of FIG. 9.

FIG. 11 is a top plan view of ribbon 1011 of FIG. 9. As shown in FIG. 11, v-shaped bending slots 2191' extend through horizontal portion 1051' of first ribbon section 1011' and provide a first gap 2271' at bend 1911' that is wider than a second gap 2391' at bend 1871'. V-shaped bending slots 2191" extend through horizontal portion 1051" of second ribbon section 1011" and provide a third gap 2271" at bend 1911" that is wider than a fourth gap 2391" at bend 1871". As with the bending slots 219 of the third ribbon 101k of FIGS. 5-8, the bending slots 2191' and 2191" allow the fourth ribbon 1011 to bend and/or otherwise flex in a horizontal plane perpendicular to the vertical portion 1011 of the ribbon 1011 (e.g., in the +x and −x directions of FIG. 11). In at least one embodiment of the invention, the gaps 2271' and 2271" may be substantially equivalent in width, giving ribbon 1011 equivalent bending ranges in the +x and −x directions. Alternatively, the gaps 2271' and 2271" may be different. Other configurations for providing the horizontal portion 1051 with lateral flexibility may be employed in place of or in addition to the V-shaped bending slots 2191' and 2191" such as uniform width bending slots or otherwise shaped slots or features. Exemplary dimensions and materials for the ribbon 1011 are described below.

Figure 12:
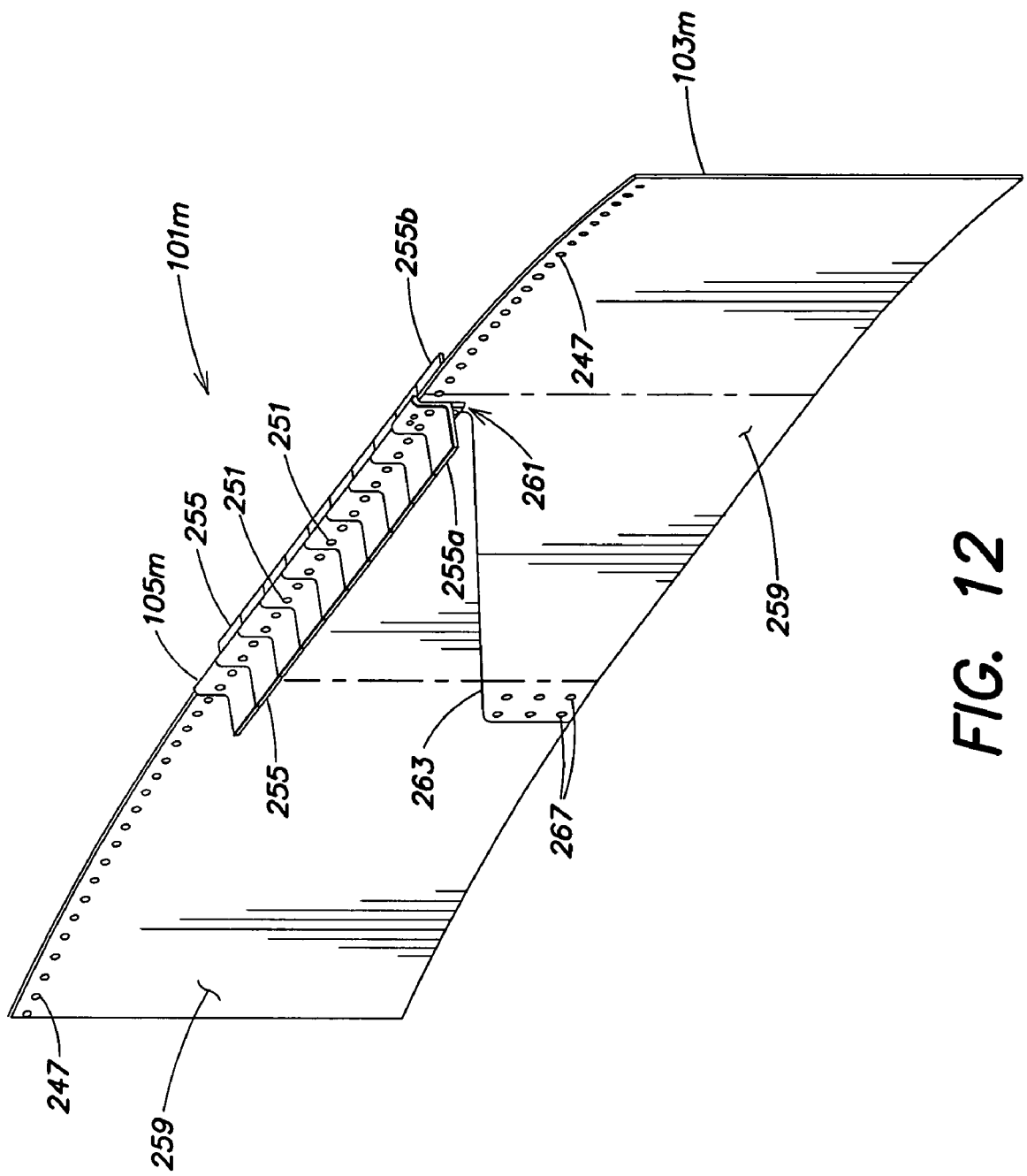
FIG. 12 is a perspective view of a fifth exemplary ribbon in accordance with the present invention having respective vertical and horizontal portions formed from separate pieces of material.

FIG. 12 is a perspective view of a fifth exemplary ribbon 101m provided in accordance with the present invention having a vertical portion 103m and a horizontal portion 105m formed from separate pieces of material. In at least one embodiment of the invention, attachment features such as holes 247 in the vertical portion 103m of the ribbon 101m correspond to attachment features (e.g., holes 251) in the horizontal portion 105m of the ribbon 101m, enabling horizontal portion 105m to be attached (e.g., bolted, riveted, or otherwise attached) to vertical portion 103m along the length of the vertical portion 103m. In another embodiment of the invention, the horizontal portion 105m may be attached to the vertical portion 103m via adhesion (e.g., using strips of adhesive tape as previously described on one or both sides of the vertical portion 103m), welding, etc., (with or without the use of attachment features).

Horizontal portion 105m may comprise separately attachable horizontal portion sections 255, shaped appropriately to permit lateral bending of vertical portion 103m without mechanical interference between horizontal portion sections 255. For example, the horizontal portion sections 255 may be shaped so as to form gaps between adjacent portion sections 255, similar to the bending features of the ribbons 101k, 1011 of FIG. 5-11, when the horizontal portion sections 255 are attached to the vertical portion 103m of the ribbon 101m. Any of the other configurations described herein for providing lateral flexibility also may be employed.

Each horizontal section portion 255 comprises a first horizontal portion 255a adapted to extend horizontally from a first side of the vertical portion 103m of the ribbon 101m, and a second horizontal portion 255b adapted to extend horizontally from a second side of the vertical portion 103m. The first and second horizontal portions 255a-b may be coupled together and/or formed from a single (continuous)

piece of material (as shown), or separate and/or formed from multiple pieces of material. Other shapes of horizontal section portions 255 than that illustrated may be employed (e.g., triangular shapes). Further, two or more of the horizontal section portions 255, the first horizontal portions 255a and/or the second horizontal portions 255b may be formed from a single (continuous) piece of material; and provided with appropriate bending features.

Vertical portion 103m may also comprise separately attachable vertical portion sections 259. For example, each vertical portion section 259 may be provided with a thinned region at an end of the vertical portion section 259 that is to be coupled to another vertical portion section 259. In this manner, the thinned regions of the vertical portion sections 259 may overlap, and be secured to one another via bolting, riveting, welding, adhesives or an other technique without significantly increasing the width and/or affecting the bending properties of the ribbon 101m. The horizontal portion sections 255 also may be employed to couple vertical portion sections 259 together (e.g., via bolts, rivets or the like which extend through two back-to-back horizontal portion sections 255a and 255b, via a clamping action when each horizontal section portion 255 is formed from a single (continuous) piece of material, etc.). Additional attachment features (e.g., holes 247, 251) may be provided within the vertical portion sections/horizontal portion sections for this purpose (as shown at location 261 in FIG. 12).

In one embodiment of the invention vertical portion sections 259 can be mated along a diagonal or otherwise oriented seam 263 and secured at features 267 (e.g., bolt or rivet holes through the vertical portion sections 259) at locations on vertical portion 103m at which vertical portion sections 259 overlap. Where vertical portion sections 259 overlap, the vertical portion sections can be half as thick as the overall width of the vertical portion 103m to maintain uniform bending properties along the length of vertical portion 103m.

If a single piece of material is used to form the entire vertical portion 103m of ribbon 101m, the two ends of the vertical portion 103m can be secured as described above to form a continuous loop. Any of the other ribbons described herein may be similarly formed from single or multiple vertical portion sections.

Exemplary embodiments for the ribbon 101a-m of FIGS. 1A-12 will now be described. It will be understood that the below listed embodiments are merely exemplary, and that other materials, dimensions and/or other parameters may be employed. For convenience, "ribbon 101" is employed to refer to any of the inventive ribbons described herein.

Selection of the material used for any of the ribbons 101 may be based on numerous factors such as material strength, flexibility, fatigue rate, cost, etc. In one or more embodiments, at least the vertical portion 103 of each ribbon 101 is formed from stainless steel, such as 301 half hard, 17-7 or another suitable stainless steel. The horizontal portion 105 of each ribbon 101 may be formed from the same, or in some cases a different material, than is employed to form the vertical portion 103 of the ribbon 101. Other suitable materials that may be employed to form the ribbon include, for example, plastic having an interior support structure such as stainless steel, or a similar material.

Selection of the thickness of the vertical portion 103 of each ribbon 101 also may be based on such factors as material strength, flexibility, fatigue rate, cost, etc. Additionally, and as described further below, numerous driving and/or constraining wheels may be employed to drive and reduce lateral motion of a ribbon as the ribbon rotates. As a ribbon passes over (or between) such driving or constraining wheels, the ribbon may deflect laterally (e.g., possibly increasing the difficulty of substrate transfer operations, requiring larger tolerances for other conveyor components, etc.). To reduce lateral deflections, the thickness of the vertical portion 103 of a ribbon 101 may be increased. However, increasing ribbon thickness increases fatigue rate of the ribbon. Accordingly, a balance between lateral deflection amount and fatigue rate may be obtained through appropriate selection of material thickness for the vertical portion 103 of a ribbon 101. In one particular embodiment wherein the ribbon 101 is formed from stainless steel, a vertical portion 103 thickness of between about 0.04-0.06 inches, and more preferably about 0.05 inches, may be employed based on these and/or other considerations. In embodiments such as the second ribbon 101b (FIG. 1B) and the fourth ribbon 101l (FIG. 9) wherein two ribbon sections are coupled together, an overall vertical portion 103 thickness of between about 0.04-0.06 inches of stainless steel, and more preferably about 0.05 inches of stainless steel, may be employed. Note that the adhesive strips 243a-c may increase the overall thickness of a vertical portion (e.g., by about 0.015 inches, depending on the adhesive strip employed). (A thicker adhesive film may have improved vibration/sound dampening, but may be more fragile.) As stated, other materials and/or other thicknesses for each ribbon 101 may be employed.

Selection of the overall height of a ribbon 101 may be based on a number of factors such as that amount of the vertical portion 103 required to accommodate the (1) horizontal portion 105 of the ribbon 101; and (2) any substrate carrier supports (described below) coupled to the ribbon 101 (e.g., at mounting locations such as the holes 197 in FIG. 5). Other factors may include, for example, the size of the wheels employed to constrain and/or drive the ribbon 101 (described below). In general, a shorter ribbon height reduces lateral curvature of a ribbon. In one particular embodiment wherein the horizontal portion 105 of a ribbon 101 consumes about 0.5 inches of the vertical portion 103 of the ribbon 101, a ribbon height of about six inches is employed, although other ribbon heights may be used. Other horizontal portion heights also may be employed.

Selection of the width of the horizontal portion 105 of a ribbon 101 may depend on, for example, the width of the device employed to support the ribbon (e.g., support wheel width, described below), the amount of lateral deviation of the ribbon 101 as it rotates, etc. In one particular embodiment, the overall width of the horizontal portion 105 is about 1.5 inches (e.g., about 0.75 inches on each side of the vertical portion 103), although other dimensions may be employed.

Selection of the width of the bending features of the horizontal portion 105 of a ribbon 101 may be based on, for example, width of the horizontal portion 105 (e.g., distance the horizontal portion 105 extends laterally from the vertical portion 103 of the ribbon), the amount the ribbon material may bend without being damaged and/or prematurely fatigued, the spacing between adjacent bending features, support wheel dimensions/wear resistance, and/or the like. In general, the larger the width of the bending feature (of a horizontal portion of a ribbon), the more the ribbon may bend, and the more a supporting wheel may wear during rotation of the ribbon. Further, a smaller spacing between adjacent bending features generally requires smaller bending feature width to obtain equivalent bending. Too small of a spacing between adjacent bending features, however, may increase ribbon manufacturing costs and/or complexity, and may decrease reliability. In one particular embodiment wherein a bending radius of about 36-48 inches is desired for a stainless steel ribbon, a uniform bending feature width of about 0.034 inches and a bending-feature-to-bending-feature spacing of about one inch may be employed. Other bending radii, bending feature sizes, and/or bending feature spacings may be provided.

Exemplary Support Systems for Inventive Ribbon

Figure 13A:
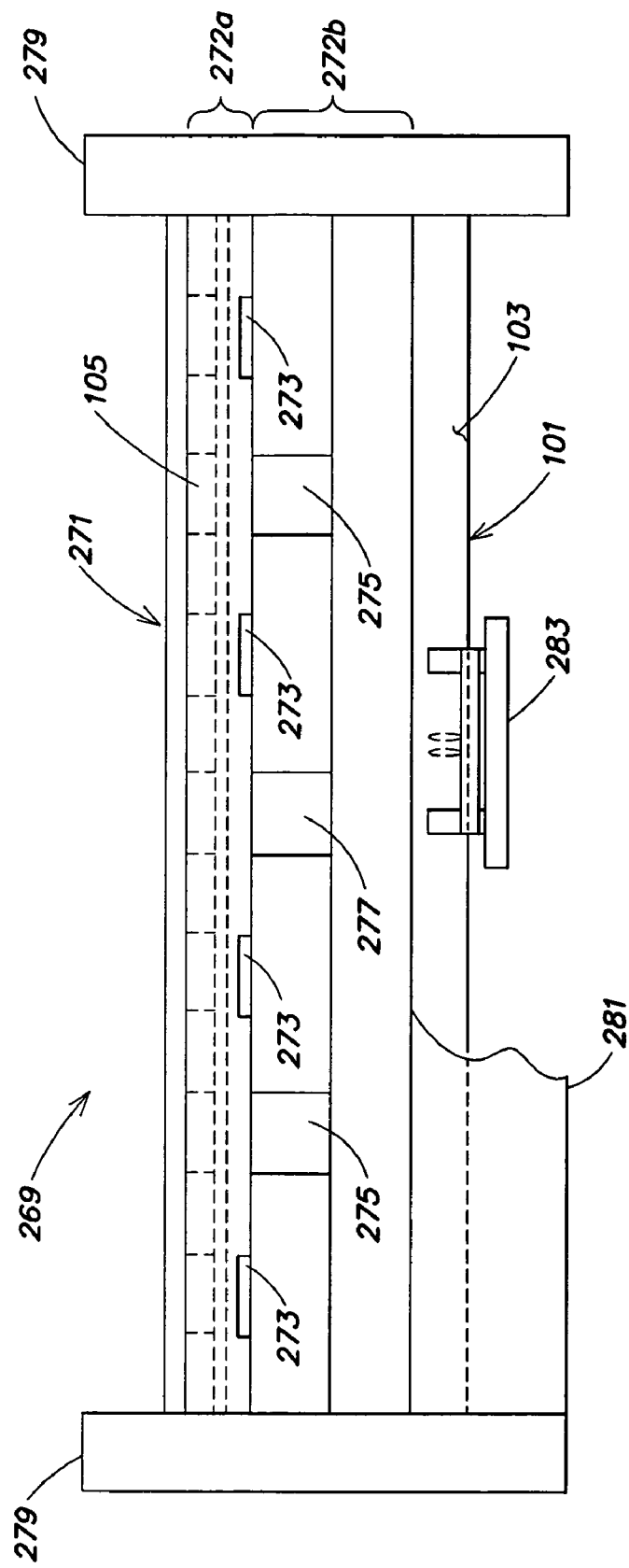
FIG. 13A is a schematic side view of a portion of an exemplary support system that may be employed to house, support, drive and/or constrain a ribbon provided in accordance within the present invention.

To form a conveyor system for transporting substrate carriers within a semiconductor device manufacturing facility employing one of the inventive ribbons 101 described herein (such as one of the conveyor systems described previously with reference to FIGS. 2-4), the ribbon must be supported and rotated. FIG. 13A is a schematic side view of a portion of an exemplary support system 269 that may be employed to house, support, drive and/or constrain a ribbon 101 (shown in phantom) within a conveyor system. In general, the support system 269 may (or may not) surround an entire closed loop formed by the ribbon 101.

The portion of the support system 269 shown in FIG. 13A includes a housing section 271 adapted to surround at least a portion of the ribbon 101. For example, a first portion 272a of the housing section 271 may surround the horizontal portion 105 of the ribbon 101, and a second portion 272b of the housing section 271 may surround at least a portion of the vertical portion 103 of the ribbon 101. Many of such housing sections may be employed to house and/or support a ribbon within a conveyor system.

The housing section 271 includes one or more first openings 273 adapted to allow at least one support wheel (not shown) to contact and support the ribbon 101 as the ribbon 101 rotates; and one or more second openings 275 adapted to allow at least one constraining wheel (not shown) to contact the ribbon 101 and to reduce lateral motion of the ribbon 101 as the ribbon 101 rotates. The housing section 271 also may include one or more third openings 277 adapted to allow a driving wheel (not shown) to contact the ribbon 101 and rotate the ribbon 101. The number of support, constraining and/or driving wheels employed may depend on a number of factors such as length of the housing section 271, whether the housing section 271 is straight or curved, whether the housing section 271 is at a location at which substrate carrier transfer operations may occur, the amount of lateral wobble of the ribbon 101 that can be tolerated within a conveyor system employing the housing section 271, etc., as described further below.

The housing section 271 of the support system 269 may be supported by one or more housing supports 279. One or more shields 281 (only a portion of one shield 281 is shown in FIG. 13A) may be coupled to the housing supports 279 and/or the housing section 271 so as to protect substrate carriers (such as substrate carrier 283 in FIG. 13A) being transported by the ribbon 101 and/or operators from the ribbon 101 and/or substrate carriers being transported by the ribbon 101. As stated, the housing section 271 may be straight or curved, depending on the portion of the ribbon 101 that is being housed and/or supported by the housing section 271.

Figure 13B:
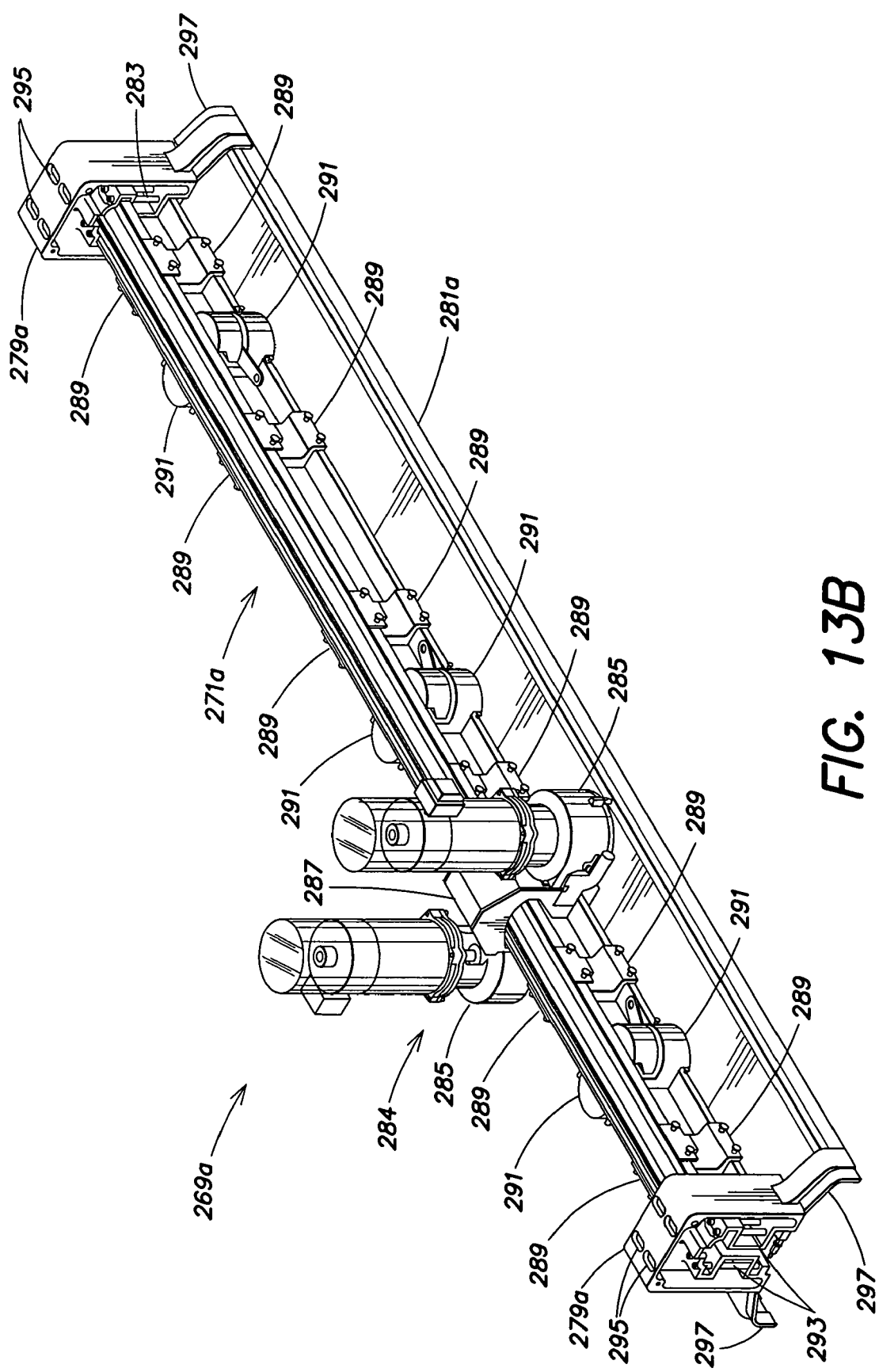
FIG. 13B is a perspective view of an exemplary straight portion of an inventive support system for housing, driving, constraining and/or supporting a portion of a ribbon provided in accordance with the present invention.
Figure 14:
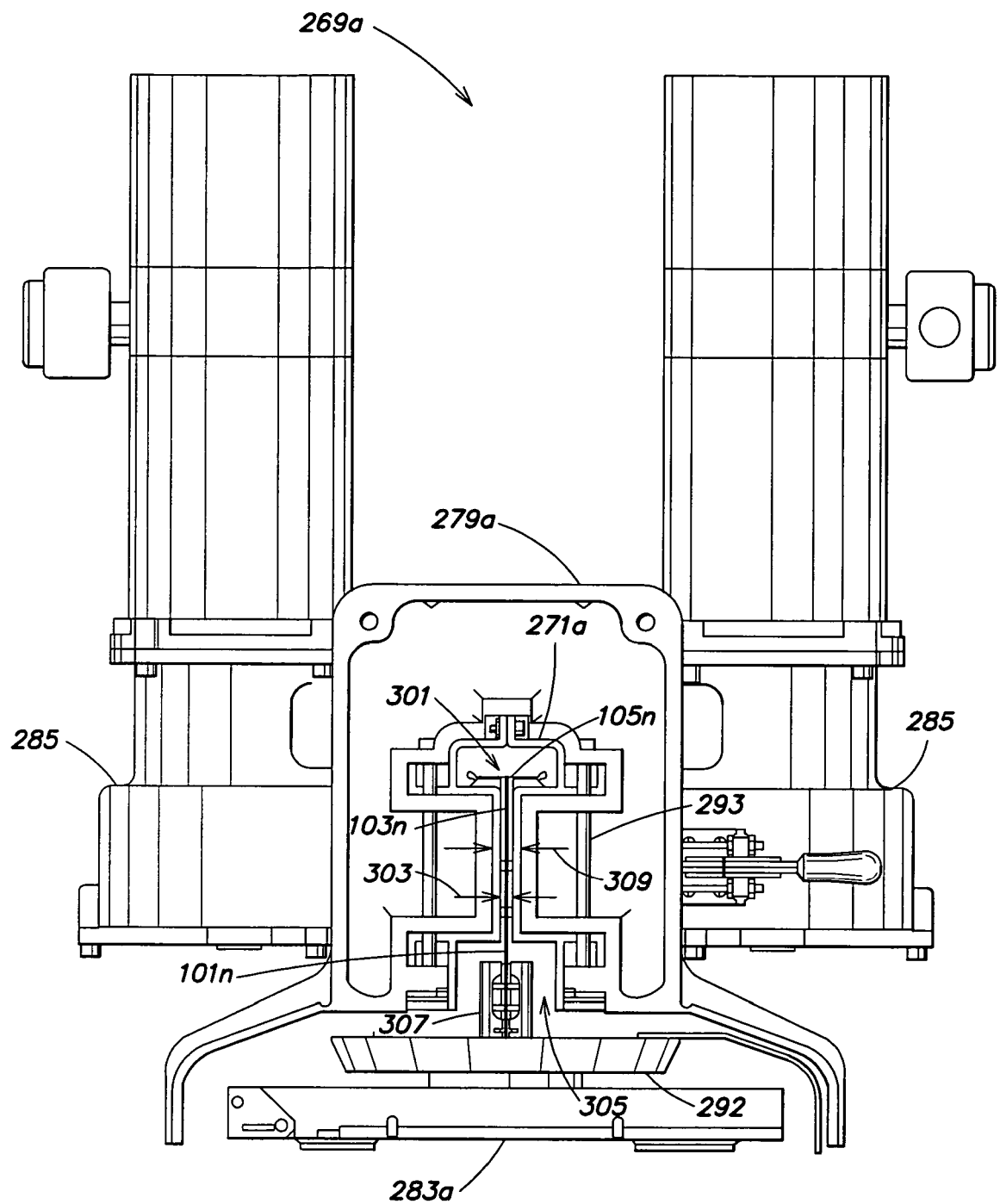
FIG. 14 is a side view of the inventive support system of FIG. 13.

FIGS. 13B and 14 are a perspective view and a side view, respectively, of an exemplary straight portion of an inventive support system 269a for housing, driving, constraining and/or supporting a portion of a sixth ribbon 101n (FIG. 14) in accordance with the present invention. The sixth ribbon 101n is similar to the first ribbon 101a of FIG. 1A, and comprises a t-shaped ribbon having a horizontal portion and vertical portion formed from a single (continuous) piece of material. Any of the other ribbons described herein may be similarly housed, driven, constrained and/or supported by the support system 269a.

Support system 269a comprises a housing section 271a, two or more housing section supports 279a adapted to support the housing section 271a, a driving wheel system 284 (which in the embodiment shown comprises two driving wheel units 285 attached to a driving wheel unit support 287 through which housing section 271a is passed), and multiple support wheel units 289 and constraining wheel units 291 attached to housing section 271a. Fewer or more numbers of supports 279a, driving wheel units 285, support wheel units 289 and/or constraining wheel units 291 may be employed.

At least a portion of ribbon 101n (FIG. 14) is housed by and is allowed to pass through housing section 271a. Ribbon 101n (FIG. 14) in turn may transport substrate carriers 283a (FIG. 14) by the use of cradles or other supports 292 (FIG. 14) as described further below. As described previously with reference to FIG. 13A, housing section 271a has openings (not shown) for allowing the wheels (not shown) of the driving wheel units 285, support wheel units 289, and constraining wheel units 291 to contact ribbon 101n as the ribbon 101n rotates (e.g., passes through housing section 271a).

In at least one embodiment of the invention, the ends of housing section 271a may slide into supports 279a and be secured therein by fasteners 293 (e.g., bolts, screws or the like). Supports 279a further provide mounting features, e.g. slotted holes 295 or other features, that permit the supports 279a together with the housing section 271a to be held aloft, e.g., from the ceiling of a semiconductor device fabrication facility.

In at least one embodiment of the invention, shields 281a (only one of which is shown in FIG. 13B) span the length of each side of housing section 271a between supports 279a, and may be held in place, for example, by supports 279a (e.g., via support regions 297 formed on each side of each support 279a) and/or by the housing section 271a. Each shield 281a is shaped such that substrate carriers 283a (FIG. 14) being transported by the ribbon 101n and supports or cradles 292 (FIG. 14) supporting such carriers are shielded from any potential impact with other objects within the semiconductor device manufacturing facility. Shields 281a may be screwed, bolted or otherwise held in place relative to the supports 279a and/or housing section 271a as shown in FIG. 13B.

In at least one embodiment of the invention, each housing section 271a is formed from a material having sufficient strength and rigidity to support the various components coupled to the housing section 271a (e.g., the driving wheel units 285, the driving wheel unit support 287, the support wheel units 289 and/or the constraining wheel units 291) and the ribbon 101n. For example, each housing section 271a may be formed of a material such as aluminum, plastic, etc. The housing section supports 279a and/or the driving wheel unit support 287 may be formed from a similar material (e.g., an aluminum casting).

The shields 281a preferably are formed from a lightweight and/or inexpensive material such as aluminum, sheet metal, vacuformed plastic, etc., so as to reduce the overall weight and expense of the support system 269a. When the shields 281a are formed of a material such as aluminum, one or more of the housing section supports 279a may include an extended support region 297 that allows a shield 281a to fit therein and/or be supported between the supports 279a despite thermally induced length variations of the shield.

Such temperature induced length changes may occur, for example, if the system 269a is fabricated/tested at a facility having a different temperature than the semiconductor device manufacturing facility in which the system 269a is eventually installed.

As shown in FIG. 14, housing section 271a forms a first gap 301, within which the horizontal portion 105n of ribbon 101n is housed and through which the horizontal portion 105n can pass. Housing section 271a also forms a second gap 303, within which the vertical portion 103n of ribbon 101n is housed and through which the vertical portion 103n can pass. The gaps 301, 303 of the housing section 271a may be sized to accommodate any of the ribbon configurations described previously, or any other ribbon configuration. As shown in FIG. 14, the housing section 271a also includes a third gap 305 sized to allow mounting hardware 307 (for supporting each cradle/support 292) to be coupled to the vertical portion 103n of the ribbon 101n.

Each housing support 279a forms an opening 309, through which a vertical end portion of housing section 271a is inserted. As stated, housing section 271a may be secured in place within each support 279a by fasteners 293 (e.g., by bolts or other fasteners that extend through flanges of housing section 271a). Exemplary embodiments of the driving wheel units 285, the support wheel units 289 and the constraining wheel units 291 are described below with reference to FIGS. 15-23.

Exemplary Inventive Driving Wheel System

Figure 15:
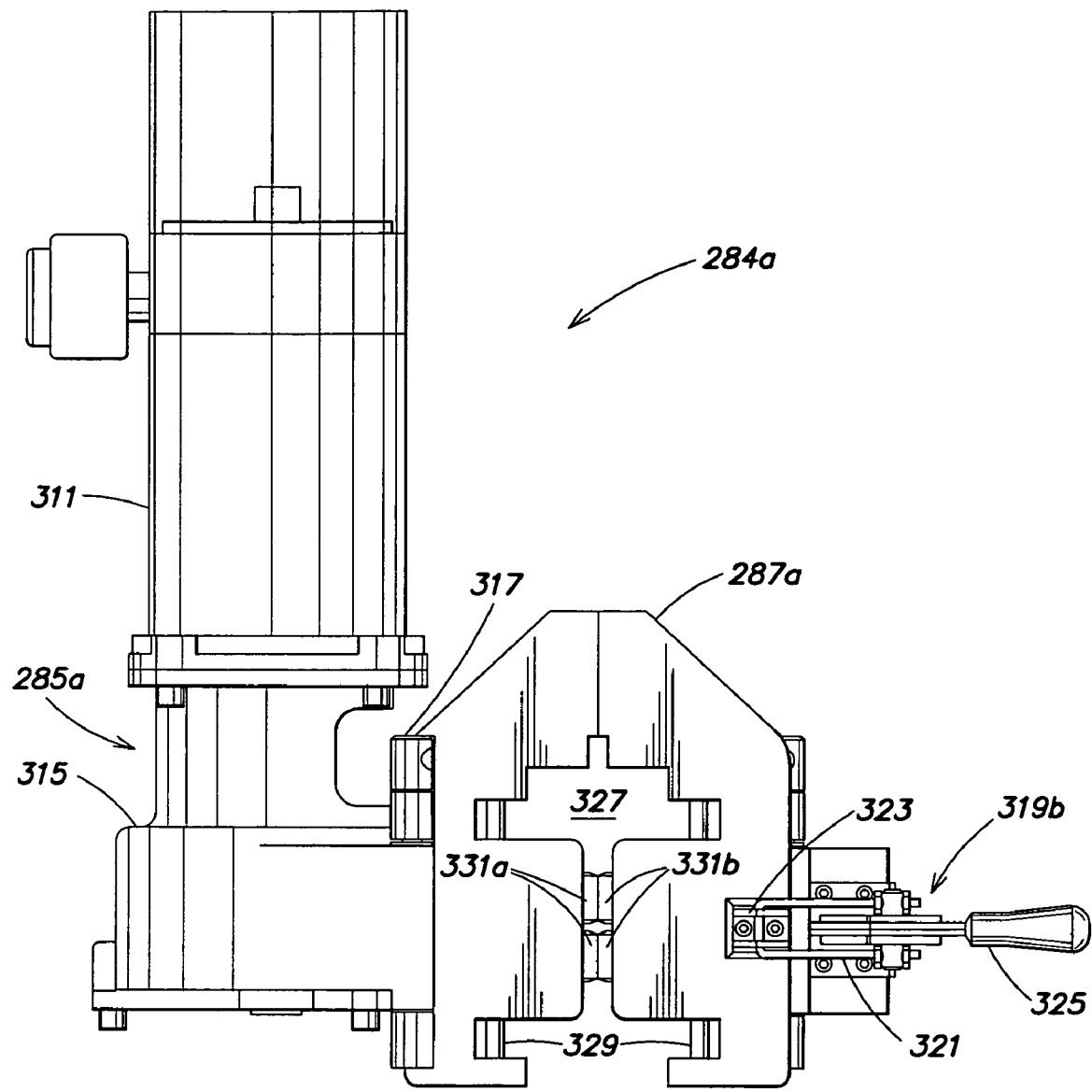
FIGS. 15 and 16 are respective front and bottom plan views of an inventive driving wheel unit attached to a driving wheel unit support in accordance with the present invention.
Figure 16:
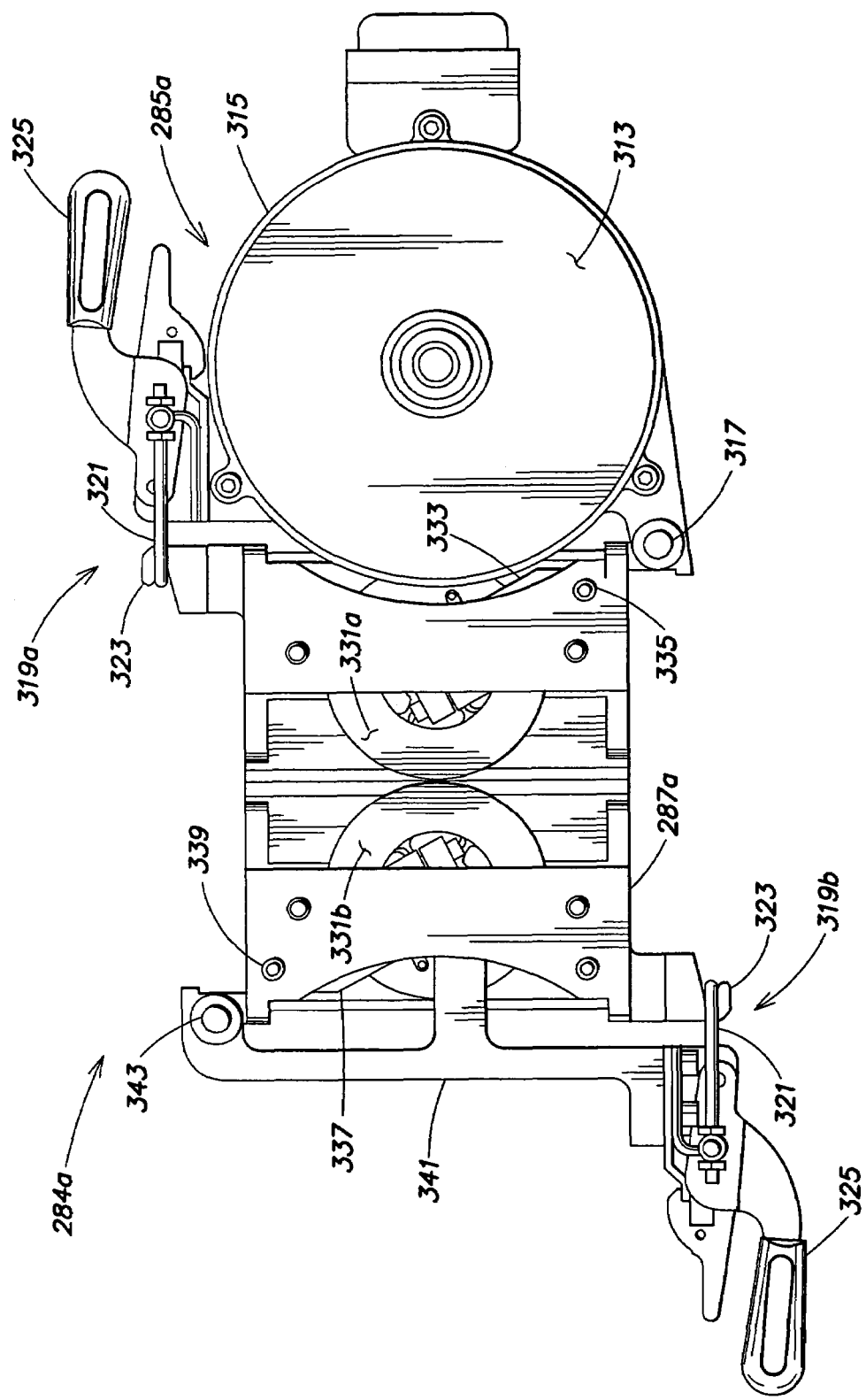

FIGS. 15 and 16 are a front plan view and a bottom plan view, respectively, of an exemplary embodiment of the inventive driving wheel system 284 of FIG. 13B, referred to as driving wheel system 284a in FIGS. 15 and 16. The driving wheel system 284a may be similar to the driving wheel system 284 of FIG. 13B and may include one or more driving wheel units 285a coupled to a driving wheel unit support 287a. In the embodiment of FIGS. 15 and 16, however, only one driving wheel unit 285a is employed.

With reference to FIGS. 15 and 16, the driving wheel unit 285a includes a motor 311 coupled to and adapted to rotate a rotating member 313 (e.g., a wheel, gear, etc.) contained within a motor housing 315 coupled to the driving wheel unit support 287a. The motor 311 may comprise, for example, a conventional servo motor or other suitable motor capable of rotating the rotating member 313 (and thus a ribbon 101 of an inventive conveyor system as described below) at an approximately constant rate.

In the embodiment shown in FIGS. 15 and 16, the motor housing 315 is coupled to the driving wheel unit support 287a via a first pivot 317 and a first latching mechanism 319a (FIG. 16). When the first latching mechanism 319a is disengaged, the motor housing 315 may pivot toward or away from the driving wheel unit support 287a; and when the first latching mechanism 319a is engaged, the motor housing 315 is held stationary relative to the driving wheel support 287a (as shown in FIGS. 15 and 16). Any suitable latching mechanism may be employed to engage/disengage the non-pivoting end of the motor housing 315 relative to the driving wheel unit support 287a. For example, the first latching mechanism 319a may comprise a ring/hoop 321 (coupled to the motor housing 315) that engages/disengages a hook 323 (coupled to the driving wheel unit 287a) in response to movement of a handle 325. Any other suitable configuration may be employed similarly.

The driving wheel unit support 287a includes an opening 327 sized to allow a housing section 271 of support system 269 (FIG. 13A or 13B) to pass therethrough, and may be coupled to the housing section 271 via any suitable fastening mechanism (e.g., bolts, screws or the like, generally represented by reference numeral 329 in FIG. 15). Other configurations may be employed. For example, the driving wheel unit support 287a may be adapted to reside on and/or couple to only one side of a housing section.

The driving wheel unit support 287a includes a first set of wheels 331a adapted to pass through an opening in a first side of a housing section 271, such as opening 277 in FIG. 13A, and contact a first side of a vertical portion 103 of a ribbon 101 contained therein (not shown in FIGS. 15 and 16). The driving wheel unit support 287a also includes a second set of wheels 331b adapted to pass through an opening, such as an opening 277, in a second side (opposite the first side) of the same housing section 271 and contact a second side of the vertical portion 103 of the ribbon 101. In this manner, the first and second sets of wheels 331a, 331b limit lateral motion of the ribbon 101. Fewer or more than two wheels per wheel set may be employed.

In the embodiment shown in FIGS. 15 and 16, the first set of wheels 331a are adapted to be contacted and driven by the rotating member 313. The first set of wheels 331a, in turn, may contact a vertical portion 103 of a first side of a ribbon 101 that passes through the driving wheel unit support 287a and drive (rotate) the ribbon 101. As stated, the second set of wheels 331b are adapted to contact a second side of the vertical portion 103 of the ribbon 101 (opposite to the first side); and reduce lateral motion of the ribbon 101 due to contact with the first set of wheels 331a. In general, one or both sets of wheels 331a, 331b may be motor driven.

The first set of wheels 331a is coupled to the driving wheel unit support 287a via a first pivot member 333 (FIG. 16) that is adapted to pivot about a second pivot 335. The first pivot member 333 (and thus the first set of wheels 331a) may be adapted to pivot toward or away from the second set of wheels 331b as the motor housing 315 pivots toward or away from the second set of wheels 331b. For example, the first pivot member 333 may be coupled to the motor housing 315 or biased (e.g., via a spring) so as to move away from the second set of wheels 331b when motor housing 315 pivots away from the second set of wheels 331b.

Likewise, the second set of wheels 331b is coupled to the driving wheel unit support 287a via a second pivot member 337 (FIG. 16) that is adapted to pivot about a third pivot 339. A latching member 341, coupled to the driving wheel unit support 287a via a fourth pivot 343 and a second latching mechanism 319b, may be employed to selectively pivot the second pivot member 337 (and thus second set of wheels 331b) away from or toward the first set of wheels 331a. The latching mechanism 319b may be similar to the latching mechanism 319a, or any other suitable latching mechanism may be employed. As stated, the second set of wheels 331b also may be driven, and configured to pivot with a driving wheel unit in a manner similar to that of the first set of wheels 331a.

In operation, a ribbon 101 (not shown) may pass through the driving wheel unit support 287a (and a housing section 271) and may be driven (rotated) at an approximately constant speed by the first set of wheels 331a. Excessive lateral motion due to contact between the ribbon and the first set of wheels 331a is limited by the second set of wheels 331b. Assuming the ribbon is driven by more than one of the driving wheel systems 284a, the first set of wheels 331a may be replaced while the ribbon is in motion by (1) releasing the latching mechanism 319a; (2) pivoting the motor housing 315 away from the first set of wheels 331a; (3) pivoting the first set of wheels 331a away from the ribbon; and (4) replacing the first set of wheels 331a. The first set of wheels 331a may then be brought back into contact with the ribbon. The second set of wheels 331b may be replaced while the ribbon is in motion via a similar operation (employing the latching mechanism 319b and the latching member 341). The first and second sets of wheels 331a, 331b (or any other portions of the driving wheel system 284a) may be replaced at the same time or at different times.

Exemplary Inventive Constraining Wheel Units

Figure 17:
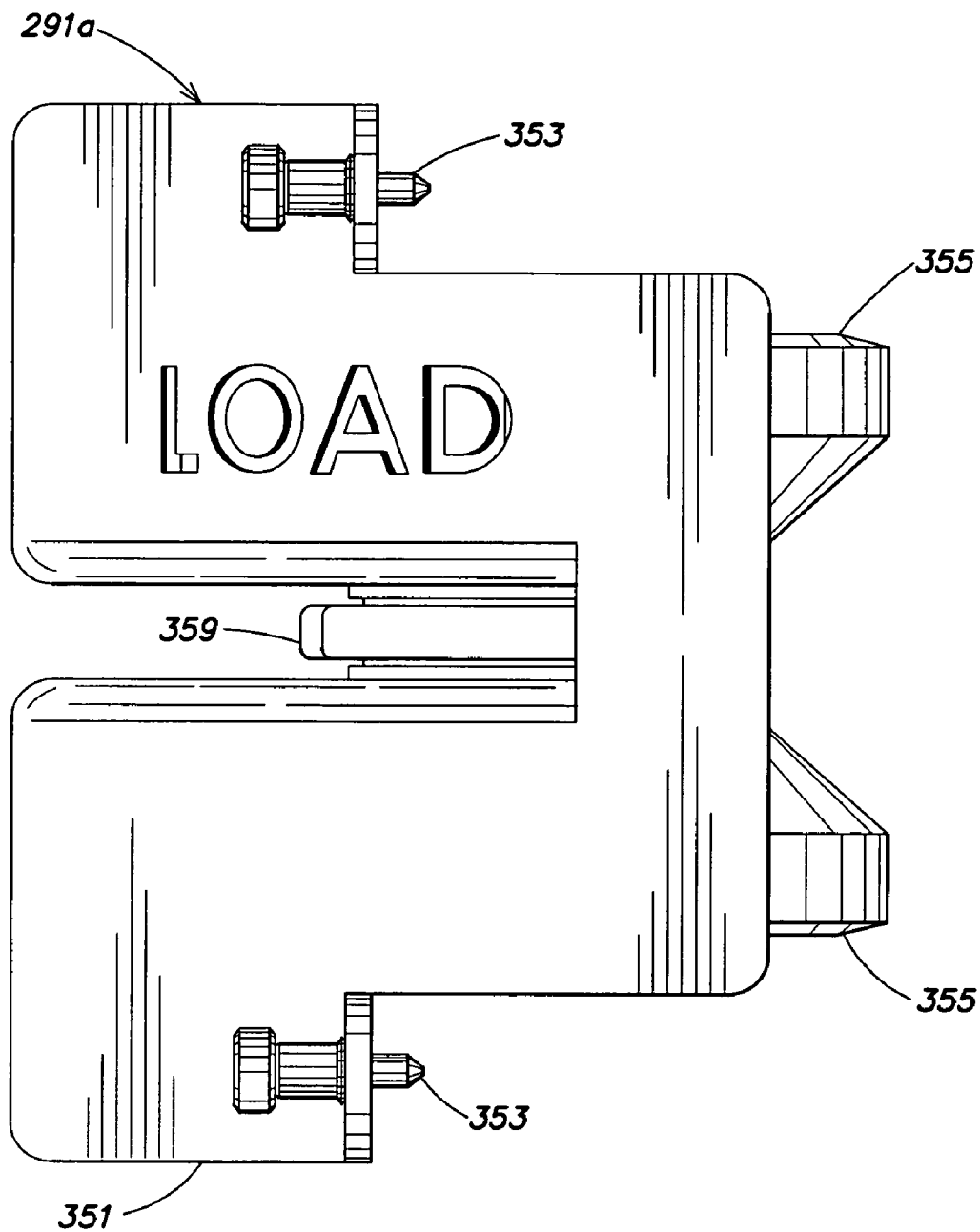
FIGS. 17 and 18 are respective rear and bottom plan views of a constraining wheel unit in accordance with the present invention in a "lock" orientation.
Figure 18:
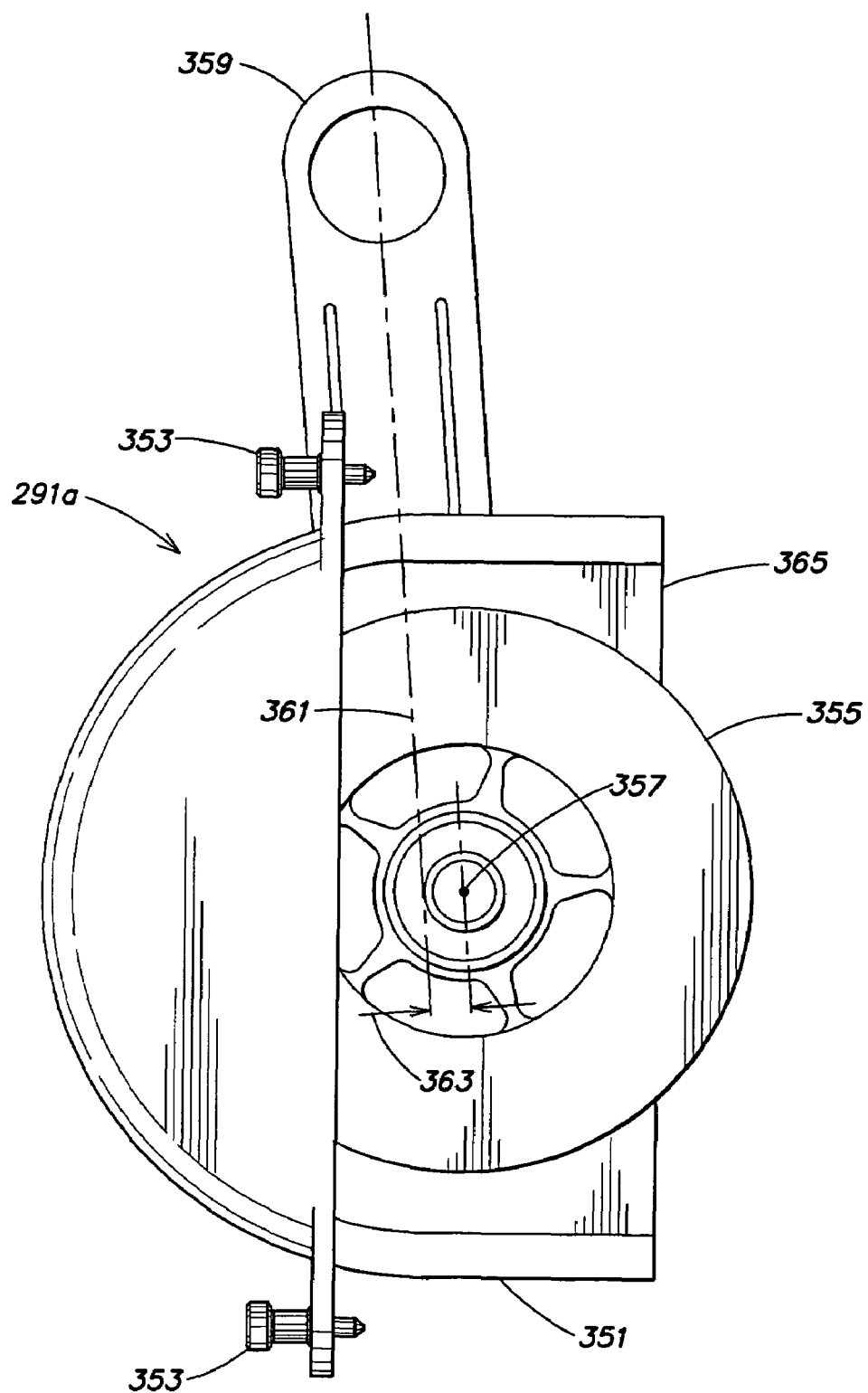
Figure 19:
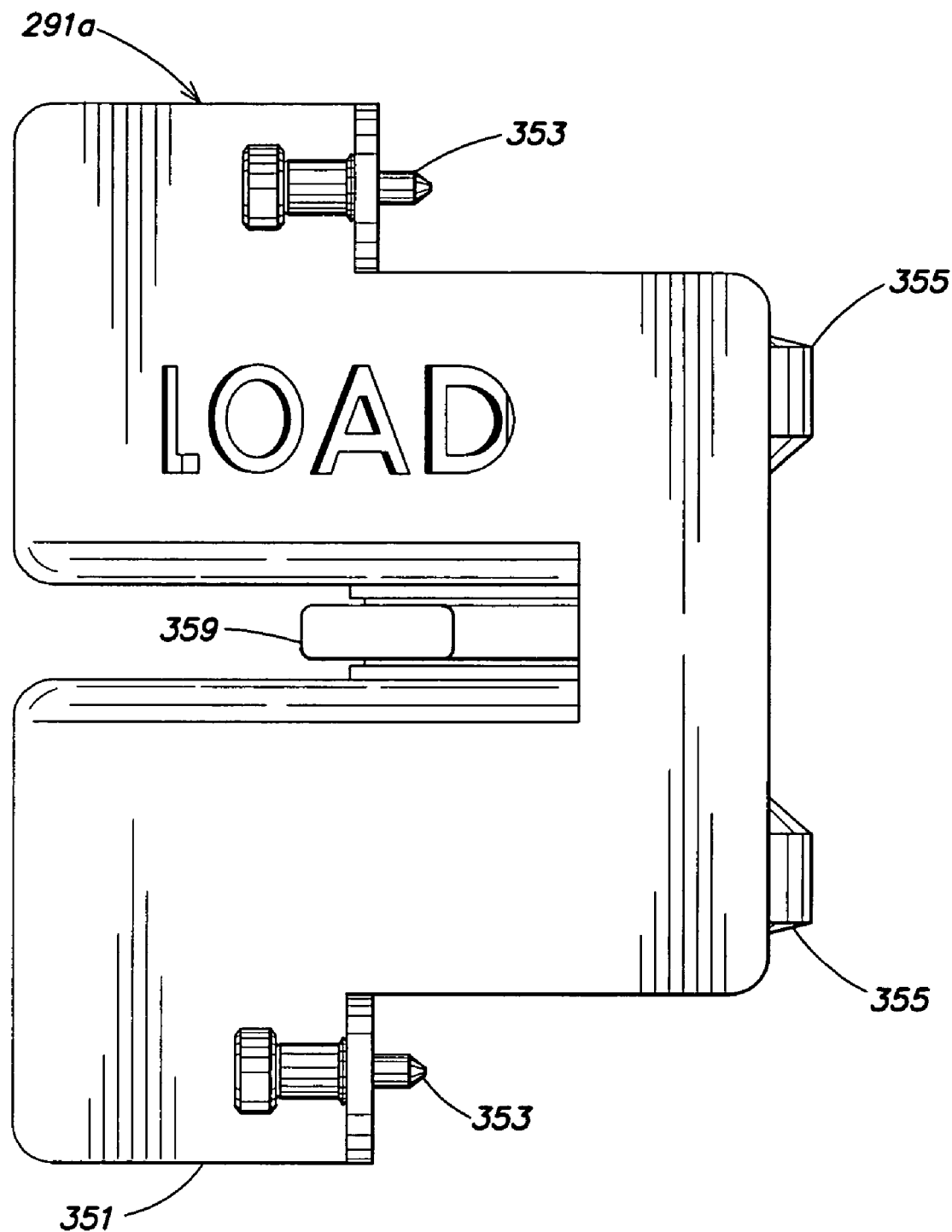
FIGS. 19 and 20 are respective rear and bottom plan views of a constraining wheel unit in accordance with the present invention in a "load" orientation.
Figure 20:
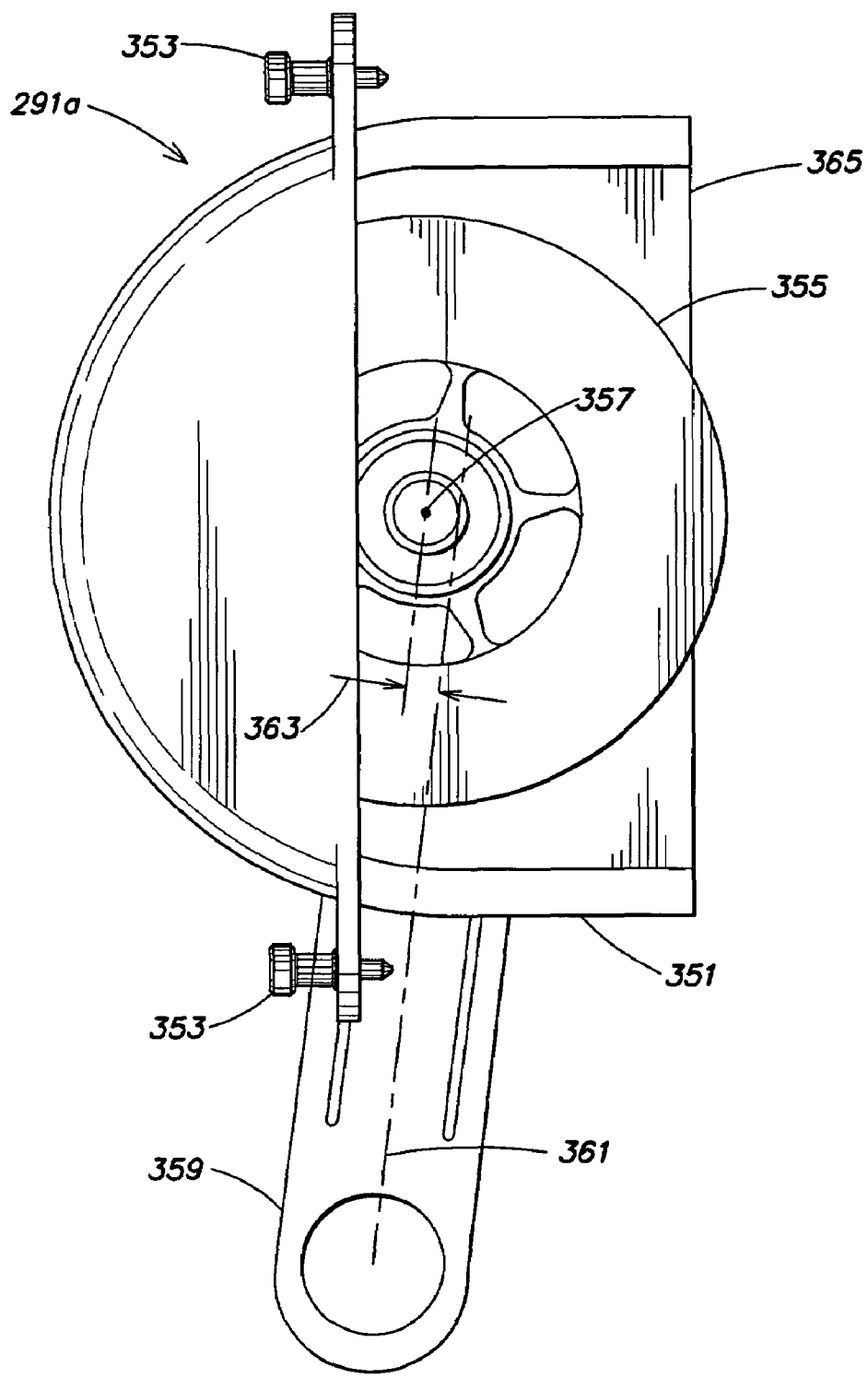

FIGS. 17 and 18 are respective rear and bottom plan views of a first exemplary embodiment of the constraining wheel unit 291 of FIG. 13B, referred to as constraining wheel unit 291a in FIGS. 17 and 18, in which the constraining wheel unit 291a is in a "lock" position with constraining wheels extended. FIGS. 19 and 20 are respective rear and bottom plan views of the constraining wheel unit 291a in a "load" position with constraining wheels retracted.

With reference to FIGS. 17-19, the constraining wheel unit 291a includes a housing 351 that is adapted to couple to an opening of a housing section 271 of support system 269 (e.g., the second opening 275 of housing section 271 in FIG. 13A, such as via one or more bolts, screws or other fasteners represented generally by reference numeral 353 in FIGS. 17-19). The housing 351 houses a pair of constraining wheels 355 that are adapted to contact and provide constrain to a ribbon 101 that passes the constraining wheels 355 as described further below. As best shown in FIGS. 18 and 20, the constraining wheels 355 are adapted to rotate about a first axis of rotation 357. Only one, or more than two, constraining wheels may be employed.

The constraining wheel unit 291a includes a lever 359 that is coupled to the constraining wheels 355 and adapted to rotate about a second axis of rotation 361 that is offset from the first axis of rotation 357 of the constraining wheels 355 (e.g., by an offset 363). In this manner, as the lever 359 is rotated into a lock position (as shown in FIGS. 17 and 18), the first axis of rotation 357 of the constraining wheels 355 is moved toward an edge 365 of the housing 351, thereby moving the constraining wheels 355 into an extended position (and into contact with a ribbon 101 passing through a housing section 271 (FIG. 13A) to which the constraining wheel unit 291a is coupled). Likewise, as the lever 359 is rotated into a load position (as shown in FIGS. 19 and 20), the first axis of rotation 357 of the constraining wheels 355 is moved away from the edge 365 of the housing 351, thereby moving the constraining wheels 355 into a retracted position (and out of contact with a ribbon 101 passing through the housing section 271 to which the constraining wheel unit 291a is coupled). The offset 363 may be determined, for example, based on the distance that the constraining wheels 355 must extend to contact a ribbon 101. In at least one embodiment, the offset may be about 3 mm, although other offsets may be employed.

In operation, the constraining wheel unit 291a is coupled to a housing unit 271 of support system 269 (not shown in FIGS. 17-20), such as at one of the second openings 275 of FIG. 13A. The lever 359 is rotated into a lock position (FIGS. 17 and 18) so that the constraining wheels 355 are brought into contact with a first side of a vertical portion 103 of a ribbon 101 (not shown) that passes through the housing section 271. When the housing section 271 is a straight section, a second constraining wheel unit 291a (not shown) preferably is employed so that a second pair of constraining wheels 355 (not shown) contact a second side of the vertical portion 103 of the ribbon 101 that is opposite the first side of the vertical portion 103. In this manner, lateral motion of the ribbon 101 as it rotates may be limited by the constraining wheel units 291a.

The constraining wheels 355 may be replaced while a ribbon 101 is in motion by (1) moving the lever 359 from the lock position (FIGS. 17 and 18) to the load position (FIGS. 19 and 20) so that the constraining wheels 355 retract from the ribbon 101; (2) removing the constraining wheel unit 291a from the housing section 271 (FIG. 13A) to which the constraining wheel unit 291a is coupled; and (3) replacing the constraining wheels 355. Only one constraining wheel 355 need be replaced if desired. The constraining wheels 355 may then be brought back into contact with the ribbon by reattaching the constraining wheel unit 291a to the housing section 271 and moving the lever 359 to the lock position (FIGS. 17 and 18).

Figure 21:
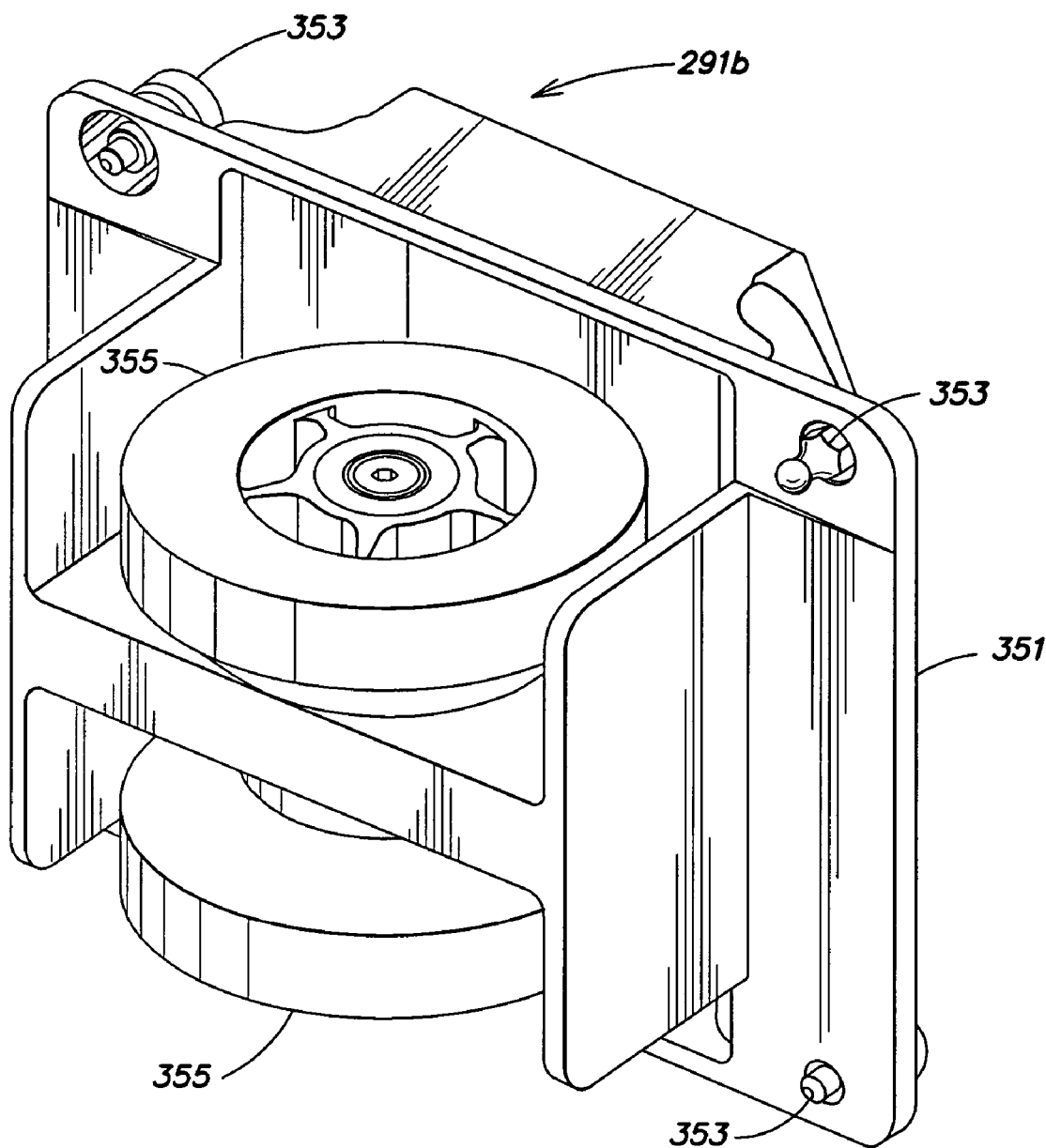
FIGS. 21 and 22 are perspective views of alternative embodiments of constraining wheel units in accordance with the present invention.

FIGS. 21 is a perspective front view of a second exemplary embodiment of the constraining wheel unit 291 of FIG. 13B, referred to as constraining wheel unit 291b in FIG. 21. The constraining wheel unit 291b is similar to the constraining wheel 291a of FIGS. 17-20, but does not employ a lever 359 to move the constraining wheels 355 between a lock and a load position. Rather, the constraining wheels 355 remained fixed relative to the housing 351 of the constraining wheel unit 291b.

The constraining wheels 355 of the constraining wheel unit 291b may be replaced while a ribbon is in motion (and is being constrained by the wheels 355) by removing the constraining wheel unit 291b from the housing section 271 (FIG. 13A) to which the constraining wheel unit 291b is coupled and then replacing the constraining wheels 355. Only one constraining wheel 355 need be replaced if desired. The constraining wheels 355 may then be brought back into contact with the ribbon by reattaching the constraining wheel unit 291b to the housing section 271. (For example, the constraining wheel unit 291b may be detached from/attached to the housing section 271 via fasteners 353.)

Figure 22:
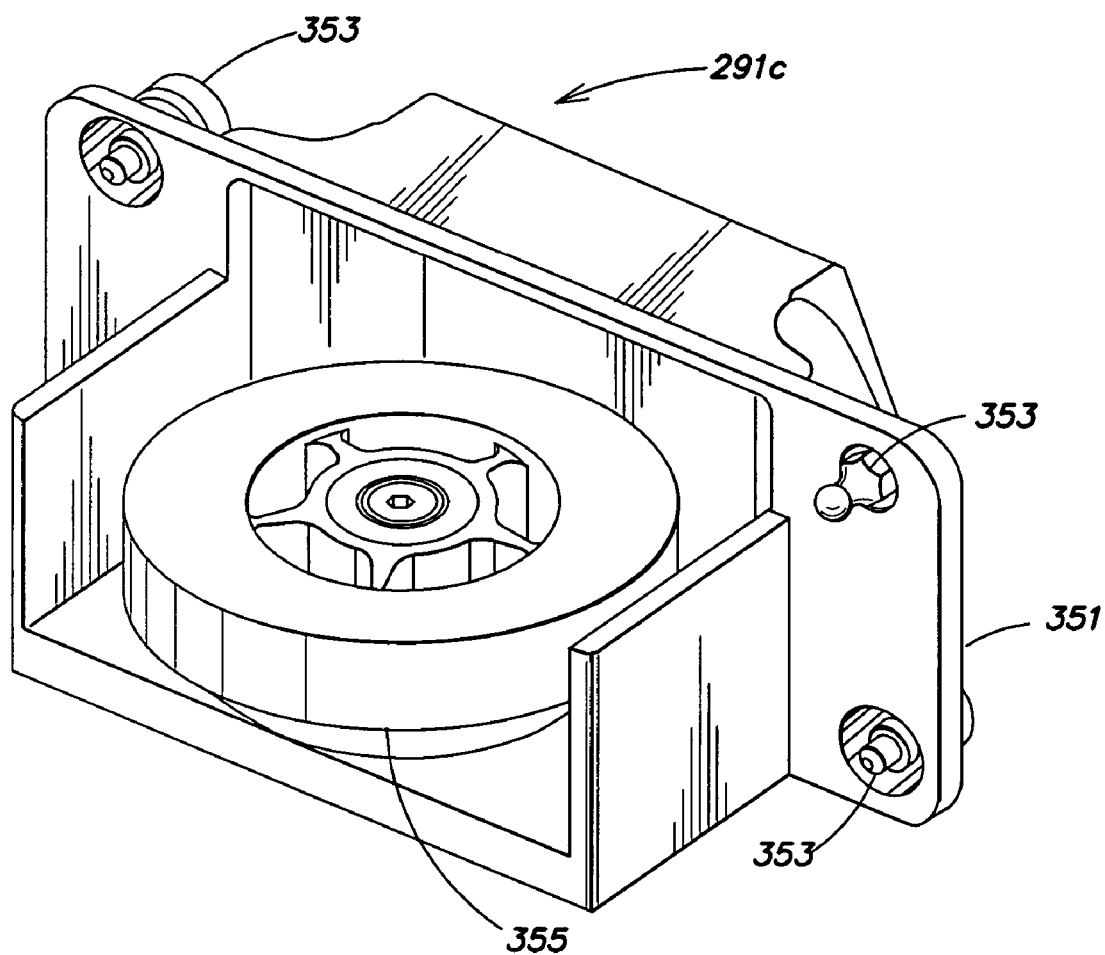

FIG. 22 is a perspective front view of a third exemplary embodiment of the constraining wheel unit 291 of FIG. 13B, referred to as constraining wheel unit 291c in FIG. 22. The constraining wheel unit 291c is similar to the constraining wheel 291b of FIG. 21, but only employs a single constraining wheel 355. For example, a first constraining wheel unit 291c may be employed to constrain a top portion of a first side of a vertical portion 103 of a ribbon 101 (not shown) and a similar, second constraining wheel unit 291c may be positioned below the first constraining wheel unit 291c and employed to constrain a bottom portion of the first side of the vertical portion 103 of the ribbon 101. The constraining wheels 355 of the first and second constraining wheel units 291c thereby may be replaced independently of one another. For example, the constraining wheel 355 of the constraining wheel unit 291c of FIG. 22 may be replaced while a ribbon is in motion by removing the constraining wheel unit 291c from the housing section 271 to which the constraining wheel unit 291c is coupled and then replacing the constraining wheels 355. The constraining wheel 355 may then be brought back into contact with the ribbon by reattaching the constraining wheel unit 291c to the housing section 271. (For example, the constraining wheel unit 291c may be detached from/attached to the housing section 271 via fasteners 353).

Exemplary Inventive Support Wheel Unit

Figure 23:
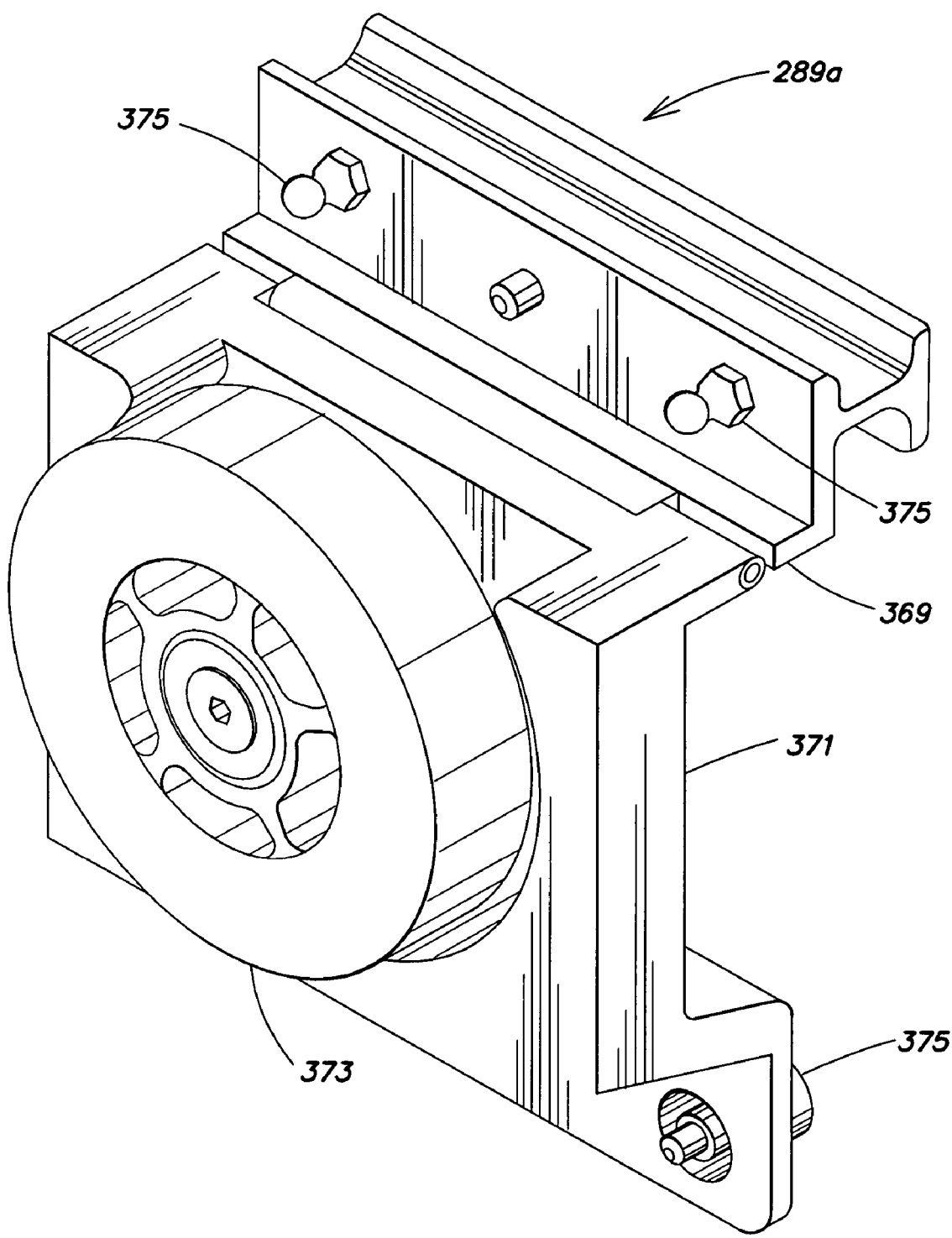
FIG. 23 is a perspective view of a support wheel unit in accordance with the present invention.

FIG. 23 is a front perspective view of an exemplary embodiment of the support wheel unit 289 of FIG. 13B, referred to as support wheel unit 289a in FIG. 23. With reference to FIG. 23, the support wheel unit 289a includes a first housing portion 369 that is hingedly coupled to a second housing portion 371. A support wheel 373 is rotatably coupled to the second housing portion 371. The first and second housing portions 369, 371 are adapted to couple to a housing section 271 of support system 269 (e.g., the first opening 273 of housing section 271 in FIG. 13A, such as via one or more bolts, screws or other fasteners represented generally by reference numeral 375 in FIG. 23).

In operation, to support a ribbon 101 (not shown) employing the support wheel unit 289a, the support wheel unit 289a is coupled to a housing section 271 (e.g., at a first opening 273 of housing section 271 of FIG. 13A). With both the first and second housing portions 369, 371 coupled to the housing section 271, the support wheel 373 extends into the housing section 271 and contacts and supports a first side of a horizontal portion 105 of the ribbon 101 as the ribbon rotates. Numerous of such support wheel units may be employed to support the rotating ribbon at other locations along the ribbon. If the ribbon 101 being supported has a horizontal portion 105 on both sides of the vertical portion 103 of the ribbon 101, one or more support wheel units may be coupled on both sides of the housing section 271 (FIG. 13B) so that the support wheel units support the ribbon 101 on both sides of the vertical portion 103 of the ribbon 101.

The support wheel 373 may be replaced while the ribbon is in motion by (1) unfastening the fasteners 375 of the second housing portion 371 of the support wheel unit 289a; (2) pivoting the second housing portion 371 (and thus the support wheel 373) away from the ribbon; and (3) replacing the support wheel 373. The support wheel 373 then may be brought back into contact with the ribbon by reattaching the second housing portion 371 to the housing 271 section.

It will be understood that the embodiments of the housing sections 271, driving wheel systems 284, support wheel units 289, and/or constraining wheel units 291 described above are merely exemplary, and that other apparatus may be employed to similarly house, drive, support and/or constrain a ribbon in accordance with the present invention. Each wheel employed with the inventive driving wheel systems 284, support wheel units 289, and/or constraining wheel units 291 may be the same or a different type of wheel. In at least one embodiment of the invention, each wheel of the driving wheel systems 284, support wheel units 289, and constraining wheel units 291 may comprise an in-line skate wheel. Any other suitable wheel/rotating member and/or material may be similarly employed (e.g., high density polyethelene wheels).

Exemplary Implementation of an Inventive Conveyor System

In accordance with the present invention, an inventive conveyor system, such as one of the conveyors 106, 121 or 155 of FIGS. 2-4, may be implemented employing one or more of the ribbons 101a-n described herein and one or more housing sections (e.g., housing section 271 (FIGS. 13A-B)), one or more driving wheel systems (e.g., driving wheel system 284 (FIGS. 13B-16)), one or more support wheel units (e.g., support wheel units 289 (FIGS. 13B and 23)) and/or one or more constraining wheel units (e.g., constraining wheel units 291 (FIGS. 13B and 17-22)) described herein. For example, a ribbon 101 may be employed to form a simple or serpentine closed loop that is (1) housed within a plurality of straight and/or curved housing sections 271; (2) driven by one or more driving wheel units 285; (3) supported by one or more support wheel units 289; and (4) constrained by one or more constraining wheel units 291.

By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the inventive conveyor to be constructed and implemented inexpensively (e.g., because the high aspect ratio ribbon is easy and inexpensive to manufacture). Because the driving wheels may contact and drive the ribbon along a vertical portion of the ribbon, and the support wheels may contact and support the ribbon along a horizontal portion of the ribbon, the driving mechanism for the ribbon is decoupled from the supporting mechanism for the ribbon and each may be serviced independently. Further, driving wheels, support wheels and constraining wheels may be replaced while the ribbon is in motion (e.g., reducing conveyor system downtime and increasing substrate throughput).

The number of housing sections 271, driving wheel units 285, support wheel units 289 and constraining wheel units 291 employed within a conveyor system depends on numerous factors such as length and/or thickness of the ribbon 101, the path traveled by the ribbon 101, the weight of the ribbon 101, the weight to be transported by the ribbon 101 (e.g., the number/weight of substrate carriers to be transported by the ribbon 101), how fast the ribbon 101 rotates, the amount of lateral stability required for the ribbon 101, etc. In one particular embodiment of an inventive conveyor system, constraining wheels 355 (of constraining wheel units 291) are spaced along and contact a vertical portion of a ribbon about every 20 inches along curved portions of the ribbon and about every 20-23 inches along straight portions of the ribbon. Support wheels 373 (of support wheel units 289) are positioned between each constraining wheel unit 291 and contact and support the horizontal portion of the ribbon. In certain applications, such a constraining wheel 355 and support wheel 373 spacing may produce a peak-to-peak lateral displacement of the ribbon of less than about 3 mm. In locations of a semiconductor device manufacturing facility in which a substrate carrier is to be loaded onto or removed from the ribbon (e.g., above a processing tool, a substrate loading station or at locations at which a substrate carrier may be transferred to or from another ribbon), a tighter tolerance in peak-to-peak lateral displacement of the ribbon may be required. For example, in some cases, a 0.5 mm or less peak-to-peak lateral displacement of the ribbon may be achieved by spacing constraining wheels 355 about every 10 inches along the ribbon (and by positioning support wheels 373 therebetween as described above). Other constraining wheel and/or support wheel spacings may be employed, as may other peak-to-peak lateral displacements for a ribbon.

In one or more embodiments of the invention, approximately ⅜ horsepower motors (of driving wheel units 285) are placed about every 28 feet along a ribbon 101 and are employed to drive driving wheels 331 of the driving wheel units 285. Other motor sizes and spacings may be employed (e.g., depending on the weight of the ribbon and/or substrate carriers transported by the ribbon, the resistance supplied by the driving, supporting and/or constraining wheels, etc.).

As described previously, each inventive ribbon 101 may be adapted to transport a plurality of substrate carriers within at least a portion of a semiconductor device manufacturing facility. For example, each ribbon may have a plurality of supports or cradles rigidly coupled to the ribbon, each adapted to support and transport a substrate carrier within the semiconductor device manufacturing facility (e.g., between substrate loading stations of processing tools). As with the ribbon 101k of FIG. 5, each other inventive ribbon 101 may comprise surface indicia, such as the one or more vertically-oriented slots 195 in FIG. 5, and mounting features, such as the holes 197 in FIG. 5, arranged at regular intervals along the length L of the ribbon 101 to respectively (1) identify the location of substrate carriers being transported by the ribbon 101; and (2) provide a secure and/or rigid mounting location for the supports or cradles for the substrate carriers. Because the location of each substrate carrier support/cradle is fixed relative to the ribbon 101, knowing the position of the ribbon 101 as it rotates provides information about the position of a substrate carrier (supported by a cradle/support rigidly coupled to the ribbon 101) being transported by the ribbon 101 and vice versa. Separate ribbon position sensors and substrate carrier position sensors need not be employed.

Figure 24:
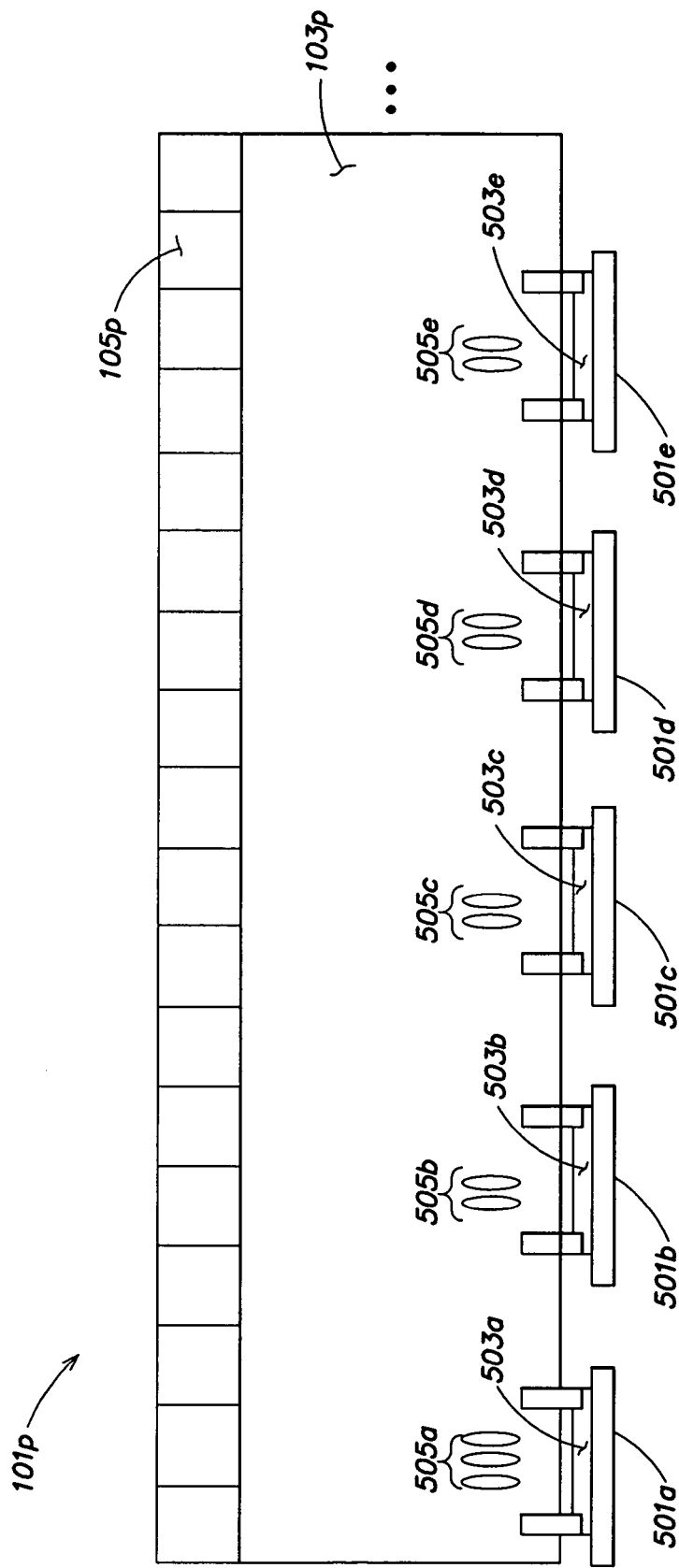
FIG. 24 is an exemplary embodiment of a sixth exemplary ribbon adapted to transport a plurality of substrate carriers.

FIG. 24 is an exemplary embodiment of a sixth exemplary ribbon 101p adapted to transport a plurality of substrate carriers 501a-e. The ribbon 101p includes a vertical portion 103p and a horizontal portion 105p, and may be configured, for example, in accordance with any of the inventive ribbons described herein. A plurality of substrate carrier supports 503a-e are coupled to the ribbon 101p, and may comprise cradles or other support members adapted to support the substrate carriers 501a-e during transport.

As shown, the vertical portion 103p of the ribbon 101p includes sets of openings or slots 505a-e each positioned above one of the substrate carrier supports 503a-e, respectively. In the particular embodiment shown, the first set of slots 505a includes three slots, while the remaining sets-of slots 505b-e include two slots per set. Other numbers of slots per set may be employed.

Each set of slots 505a-e is configured to allow a beam of light (not shown) to pass through the vertical portion 103p of the ribbon 101p above a substrate carrier support 503a-e. At all other locations on the ribbon 101p, the beam of light is blocked by the ribbon 101p. Accordingly, by monitoring and detecting the light beam as it passes through the ribbon 101 (e.g., via a detector and/or a controller not shown), the position of the ribbon 101p, a substrate carrier support 503a-e and/or a substrate carrier 501a-e may be determined. Further, by monitoring and detecting the different light beam pattern generated by the first set of slots 505a relative to the remaining sets of slots 505b-e, the "front" or some other reference position of the ribbon 101p may be determined (whether or not the ribbon 101p forms a closed loop). If the spacing between each substrate carrier support 503a-e is known, such a reference position may be employed to determine the position of each substrate carrier 501a-e/substrate carrier support 503a-e (e.g., even if the other sets of slots 505b-e are not present).

Knowledge of the position of each substrate carrier 501a-e and/or substrate carrier support 503a-e also may be employed to determine/monitor speed of the ribbon 101p. For example, by determining a time between successive breakings of a light beam by any of the slots of one of the sets 505a-e, or between slot sets 505a-e, speed of the ribbon may be determined (e.g., by a controller (not shown) having information regarding spacing between slots of sets and/or slot sets). Other opening shapes or surface features (e.g., reflective features) also may be employed to determine ribbon, substrate carrier support and/or substrate carrier position and/or speed.

With knowledge of substrate carrier position, substrate carriers 501a-e may be loaded onto or unloaded from the ribbon 101p (e.g., whether or not the ribbon 101p is in motion). In at least one embodiment of the invention, substrate carriers 501a-e may be loaded onto or unloaded from the ribbon 101p while the ribbon 101p is in motion as described for example, in previously incorporated U.S. patent application Ser. No. 10/650,481, filed Aug. 28, 2003 and titled "Method and Apparatus for Unloading Substrate Carriers from Substrate Carrier Transport Systems" or U.S. patent application Ser. No. 10/650,480, filed Aug. 28, 2003 and titled "Substrate Carrier Handler That Unloads Substrate Carriers Directly From a Moving Conveyor". Other apparatus/systems also may be employed.

The ribbon 101p (and any other inventive ribbons described therein) thus is an "encoded" ribbon or band that contains encoded information such as band speed, substrate carrier position, substrate carrier hand-off locations, etc., that may be read and seen by multiple tools, such as the substrate loading station described in previously incorporated U.S. patent application Ser. No. 10/650,480, filed Aug. 28, 2003 and titled "Substrate Carrier Handler That Unloads Substrate Carriers Directly From a Moving Conveyor" (e.g., a high speed, bay distributed stocker). Such substrate carrier loading stations may act as "slaves" to the "master" ribbon/conveyor, measuring conveyor speed, substrate carrier position, hand-off positions, etc., from the ribbon/conveyor. A system with distributed intelligence (e.g., each substrate carrier loading station and/or the conveyor) thereby may be provided. Each tool may have a read head (e.g., a plurality of sensors that read the slots or openings in the band to determine band speed, substrate carrier position, hand-off positions, etc.) that reads encoded information on the inventive ribbon (e.g., a central encoder that includes information stored via the placement/positioning of the slots/openings in the band such as the slot sets 505a-e).

It should be noted that while substrate carriers are being transported within a semiconductor device manufacturing facility on the ribbon-based conveyor system of the present invention, the vertical, longitudinal (in the direction of the conveyor), and horizontal (side-to-side from the line of the conveyor) positions of the ribbon may be determined and/or controlled to a high degree of accuracy. In this manner, transfer of substrate carriers from or to the conveyor system, while the conveyor system is in motion, is facilitated.

The dimensions of the driving, support and/or constraining wheels can be inspected both as new, such as before installation, and after the conveyor system has been in operation (e.g., to check for wear). Adjustments to position of the driving, support and/or constraining wheels thereafter may be performed to ensure/retain tight control over the vertical, longitudinal and/or horizontal positions of the conveyor system. For example, the axis of rotation of the support wheels can be controlled for proper vertical position and/or horizontal orientation of the ribbon of the conveyor system, such as by position adjustment means (screws, adjustable spacers or the like, not shown) between the housing section 271 and the support wheels. Holding to tight tolerances within and between conveyor system components such as the driving, support and/or constraining wheels (e.g., through frequent inspections and/or replacements), may reduce or eliminate the need for such adjustability.

Although a ribbon comprising a continuous piece of material throughout its entire length is advantageous in certain implementations, a plurality of connectable longitudinal sections can be employed to form a ribbon, for example as part of a custom installation in order to provide a desired path for the ribbon. In one or more embodiments of the invention, overall length of the ribbon may be of little concern; rather, it may be more important to ensure that the ribbon coincides with paths set by semiconductor device processing tools arranged, for example, in one or more straight lines in a manufacturing facility. As such, the radius of the ribbon as it turns between the straight-line paths of processing tools may be variable. The length of the ribbon may therefore vary with the selected radius or radii of the ribbon. In addition, the ribbon may be housed along its entire length; or certain portions of the ribbon may not be housed by a housing section. Also, instead of housing sections passing through a gap in a driving wheel unit support, two separate housing sections may interface with/at a driving wheel unit support, and the driving wheel unit support may be suspended in a manner similar to the housing section supports described previously.

In at least one embodiment of the invention, all serviceable parts of the inventive conveyor system may be serviced while the conveyor (e.g., ribbon) is in motion. For example, all wheels, motors, motion drivers, band controllers, etc., may be replaced while the conveyor system is in motion. Further, significant redundancy may be built into each of these components so that one or more wheels, motors, motion drivers, band controllers, etc., may fail without affecting (or significantly) affecting motion of the conveyor system. That is, the conveyor system may be maintained in motion despite failure of one or more supporting, driving, controlling, etc., components. Spacing of wheels and/or other components may be such that each may be replaced while still meeting system requirements for support, drive force, etc.

In addition to transporting single substrate carriers, the inventive conveyor system may be used to transport substrate carriers that transport multiple substrates. Further, substrate carriers need not be sealed (e.g., may be opened on one or more sides).

The inventive conveyor system may include a ribbon that is vertically supported from underneath (e.g., from underneath a vertical portion of the ribbon). The ribbon may be supported by any means (e.g., magnetically, via air bearings, etc.).

As stated, selection of the material used for any of the ribbons 101 may be based on numerous factors such as material strength, flexibility, fatigue rate, cost, etc. Exemplary materials that may be employed for any of the inventive ribbons described herein include stainless steel, polycarbonate, composite materials (e.g., carbon graphite, fiberglass, etc.), steel or otherwise reinforced polyurethane, epoxy laminates, plastic or polymer materials that include stainless steel, fabric (e.g., carbon fiber, fiberglass, Kevlar® available from Dupont, polyethelene, steel mesh, etc.) or another stiffening material, etc. In one particular embodiment, a ribbon may be constructed using a single or multi-piece molded or extruded material such as extruded polyurethane with a steel reinforcing cable or glass filled polyurethane inserts. A multi-piece ribbon may be laminated to form a single piece construction (e.g., by bonding stainless steel sheets to plastic). Any other suitable configuration may be employed.

In one embodiment of the invention, the vertical portion of the ribbon may comprise 301 stainless steel (half hard) having a thickness of about 0.05 inches. The horizontal portion may comprises approximately 1 inch wide 6061-T6 aluminum pieces attached to the vertical portion (e.g., via rivots or another mechanism) and spaced by about 0.06 inches. Such a ribbon may be similar to the ribbon described previously with reference to FIG. 12. Other materials and/or dimensions may be employed.

Figure 25B:
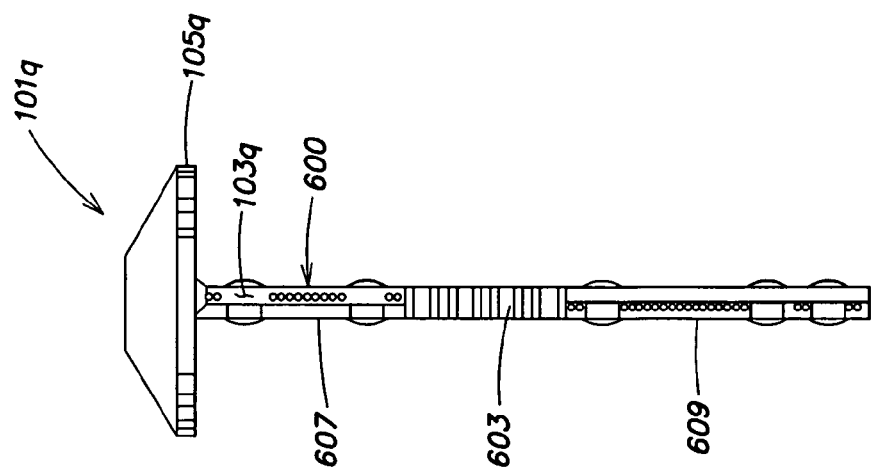
FIGS. 25A and 25B are a perspective view and a side view, respectively, of a seventh exemplary ribbon provided in accordance with the present invention.
Figure 25A:
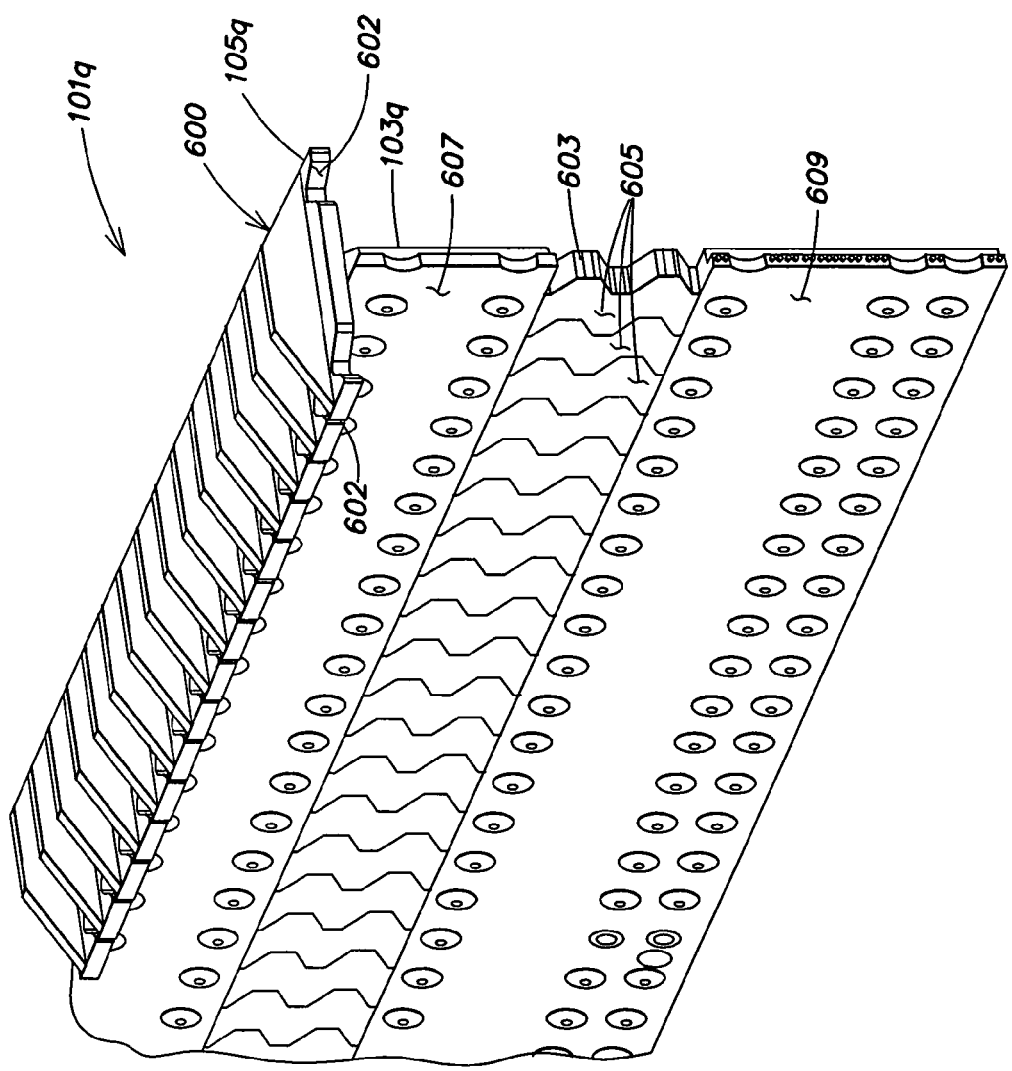

FIGS. 25A and 25B are a perspective view and a side view, respectively, of a seventh exemplary ribbon 101$q$ provided in accordance with the present invention. With reference to FIGS. 25A-B, the ribbon 101$q$ includes a T-section 600 (which forms the vertical portion 103$q$ and the horizontal portion 105$q$ of the ribbon 101$q$) formed from glass filled nylon, a rigid plastic, cast aluminum or the like. The horizontal portion 105$q$ includes serpentine gaps 602 that allow the ribbon 101$q$ to bend (in a horizontal plane) and provide a smooth transition for the support wheels used to support the ribbon 101$q$. The vertical portion 103$q$ includes a thickened section 603 formed from a plurality of interleaved fingers 605 that form a relatively incompressible driving surface for the driving wheels that are employed to drive the ribbon 101$q$.

Two belts 607, 609 are attached to the vertical portion 103$q$ above and below the thickened section 603 as shown, and may be attached thereto by any suitable mechanism (e.g., bolts, rivots, adhesives or the like). In one embodiment of the invention, the belts 607, 609 may be formed of polyurethane or a similar material (e.g., reinforced with steel cords or the like).

While the inventive ribbons have been described herein primarily as having a single horizontal portion (e.g., a portion 105), it will be understood that each ribbon may include more than one horizontal portion. For example, providing a horizontal portion near both a top and bottom of a ribbon, forming a double "T"-type configuration, tends to balance the bending moment of the ribbon (within a horizontal plane). In such an embodiment, lower support wheels may be employed to contact the bottom horizontal portion and stabilize the ribbon (and any substrate carrier supported thereon) in turns and critical transfer areas. Such lower support wheels may be similar to the support wheels 373 of the support wheel unit 289$a$ of FIG. 23, or otherwise configured.

Figure 26:
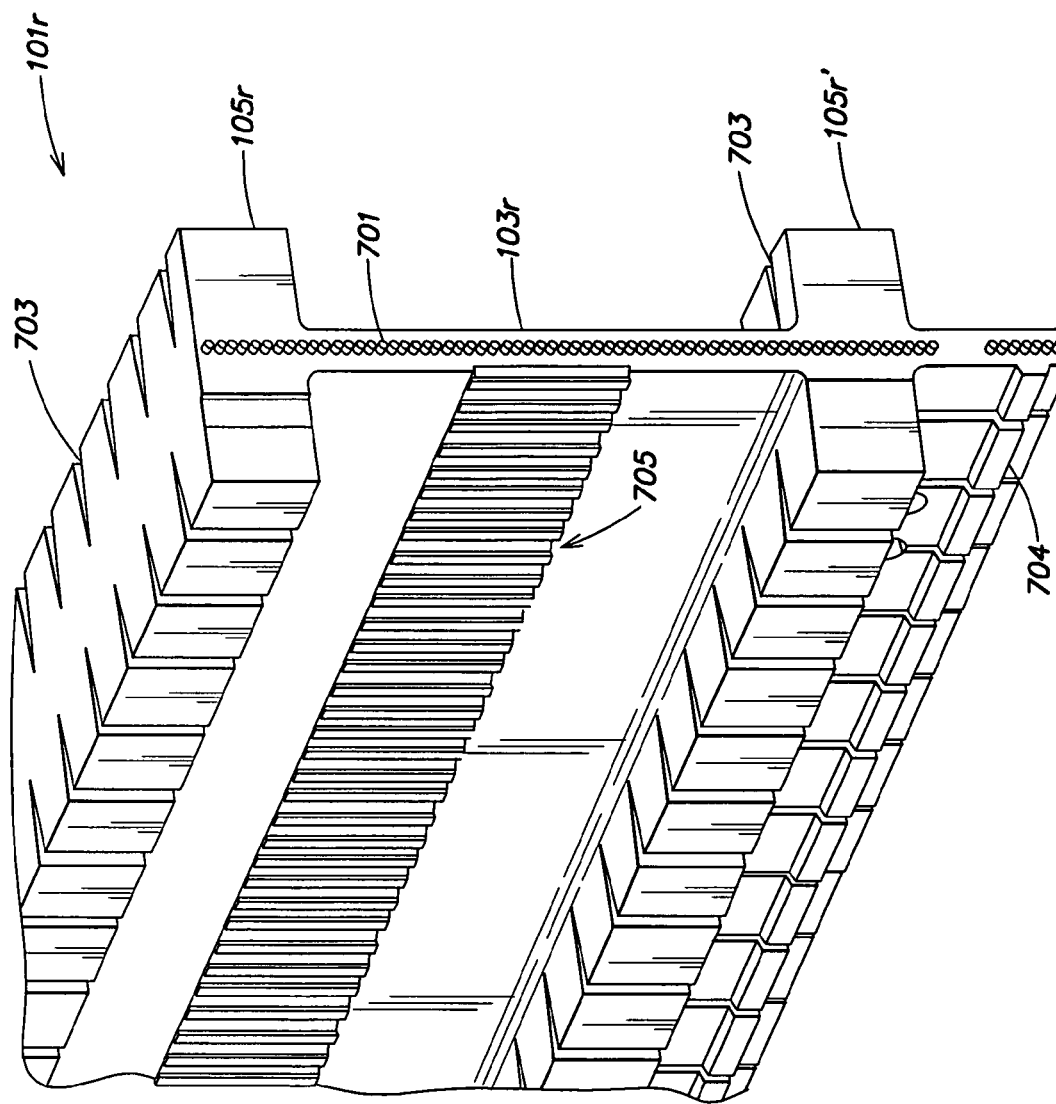
FIG. 26 is a perspective view of an eighth exemplary ribbon provided in accordance with the present invention.

FIG. 26 is a perspective view of an eighth ribbon 101$r$ provided in accordance with the present invention. The eighth ribbon 101$r$ includes a vertical portion 103$r$ and two horizontal portions 105$r$, 105$r'$. The upper horizontal portion 105$r$ is adapted to support the load of the ribbon 101$r$ (e.g., via support wheels previously described); and the lower horizontal portion 105$r'$ allows the ribbon 101$r$ to bend more symmetrically. In at least one embodiment of the invention, the ribbon 101$r$ is formed of polyeurethane (e.g., 92 durometer poly) or a similar material. The ribbon 101$r$ may be reinforced with steel cords, fabrics or similar structural features 701. In such an embodiment, lower support wheels may be employed to contact the lower horizontal portion 105$r'$ and stabilize the ribbon 101$r$ (and any substrate carrier supported thereon) in turns and critical transfer areas. Gaps or notches 703 are formed in the horizontal portions 105$r$, 105$r'$ to assist in bending of the ribbon 101$r$. The ribbon 101$r$ may be formed as a single piece or from multiple pieces (e.g., a plurality of extruded portions that are laminated together). As shown in FIG. 26, horizontal or other features 704 may be formed in the ribbon 101$r$ to provide additional support for substrate carriers being transported by the ribbon 101$r$.

As stated, the support wheels 373 (FIG. 23) are adapted to support a ribbon via contact with a horizontal portion of the ribbon. While described herein a primarily passive (e.g., non-driven), it will be understood that one or more of the support wheels 373 may be driven in addition to or in place of the driving wheels 331a and/or 331b. One or more support wheels 373 thereby may drive a ribbon through contact with a horizontal portion of the ribbon. For a flat horizontal portion, an opposing wheel may be employed opposite a driven support wheel (e.g., to maintain contact pressure on the driven support wheel). Likewise, one or more of the constraining wheels 355 may be similarly driven.

To provide two independent driving points at or near one location, drive locations on each side of a ribbon may be offset slightly. For example, the first set of wheels 331a of a driving wheel unit support 287a may be offset slightly along a length of a ribbon relative to the second set of wheels 331b of the driving wheel unit support 287a. In one or more embodiments of the invention, a ribbon may include surface features such as teeth that engage wheels, gears or other driving mechanisms that drive the ribbon. Such features may be formed on a vertical and/or horizontal portion of the ribbon. FIG. 26 illustrates a plurality of teeth 705 formed on (e.g., molded in) at least one side of the vertical portion 103r of the ribbon 101r. Such teeth 705 may be engaged by a driving wheel and employed to drive the ribbon 101r (e.g., in a rack and pinion or other similar arrangement).

To minimize drive motor interactions and protect a driven ribbon, a unidirectional drive clutch may be employed for each drive motor 311 (e.g., such that torque may only be applied in one direction). In this manner, if a motor bearing seizes during operation, a rotating ribbon may back drive the affected drive wheel 311 rather than allow the drive wheel 311 to skid or slide along a surface of the ribbon. A ribbon may be adapted to carry substrates or substrate carriers. A ribbon may carry single substrate carriers, substrate carriers adapted to house more than one substrate (e.g., multiple substrate carriers) or a combination of different size substrate carriers (e.g., single and multiple substrate carriers).

Accordingly, while the present invention has been disclosed in connection with exemplary embodiments thereof, it should be understood that other embodiments may fall within the spirit and scope of the invention as defined by the following claims.

The invention claimed is:

1. A conveyor system adapted for use in delivering substrate carriers within a semiconductor device manufacturing facility comprising:
a ribbon that forms a closed loop along at least a portion of the semiconductor device manufacturing facility;
a plurality of supports rigidly coupled to the ribbon, each support adapted to support and transport a substrate carrier within the at least the portion of the semiconductor device manufacturing facility; and
a plurality of housing sections adapted to surround at least a portion of the ribbon while allowing substrate carriers to be transported by the ribbon;
wherein at least one housing section comprises:
a first opening adapted to allow at least one support wheel to contact and support the ribbon as the ribbon rotates; and
a second opening adapted to allow at least one constraining wheel to contact the ribbon and to reduce lateral motion of the ribbon as the ribbon rotates.

2. The conveyor system of claim 1 wherein the ribbon is adapted to continuously rotate during transport and delivery of substrate carriers.

3. The conveyor system of claim 1 further comprising at least one of a driving wheel, a constraining wheel and a support wheel adapted to contact the ribbon and to be changed while the ribbon is in motion.

4. The conveyor system of claim 1 wherein the ribbon comprises:
a vertical portion adapted to support substrate carriers; and
a horizontal portion adapted to support a weight of the ribbon.

5. The conveyor system of claim 1 wherein the ribbon comprises:
a first section having:
a vertical portion adapted to support substrate carriers; and
a horizontal portion adapted to support a weight of the ribbon; and
a second section coupled to the first section and having:
a vertical portion adapted to support substrate carriers; and
a horizontal portion adapted to support a weight of the ribbon.

6. The conveyor system of claim 1 wherein the ribbon comprises stainless steel.

7. The conveyor system of claim 1 wherein the ribbon comprises a vertical portion having a first feature adapted to identify a beginning of the ribbon.

8. The conveyor system of claim 7 wherein the vertical portion of the ribbon further comprises a plurality of second features, each second feature adapted to identify a location at which a substrate carrier may be held and transported by the ribbon.

9. The conveyor system of claim 1 wherein the ribbon forms a serpentine closed loop.

10. The conveyor system of claim 1 wherein the at least one housing section further comprises:
a third opening adapted to allow at least one driving wheel to contact the ribbon and to rotate the ribbon.

11. The conveyor system of claim 1 further comprising a plurality of housing section supports adapted to couple to and support each housing section.

12. The conveyor system of claim 11 further comprising a plurality of shields adapted to couple to the plurality of housing section supports and sized to cover substrate carriers being transported by the ribbon.

13. The conveyor system of claim 1 wherein the ribbon is adapted to transport single substrate carriers.

14. A conveyor system adapted for use in delivering substrate carriers within a semiconductor device manufacturing facility comprising:
a ribbon that forms a closed loop along at least a portion of the semiconductor device manufacturing facility;
a plurality of supports rigidly coupled to the ribbon, each support adapted to support and transport a substrate carrier within the at least the portion of the semiconductor device manufacturing facility;
a plurality of housing sections adapted to surround at least a portion of the ribbon while allowing substrate carriers to be transported by the ribbon;
a plurality of housing section supports adapted to couple to and support each housing section; and
a plurality of shields adapted to couple to the plurality of housing section supports and sized to cover substrate carriers being transported by the ribbon.

15. The conveyor system of claim 14 wherein the ribbon is adapted to continuously rotate during transport and delivery of substrate carriers.

16. The conveyor system of claim 14 further comprising at least one of a driving wheel, a constraining wheel and a support wheel adapted to contact the ribbon and to be changed while the ribbon is in motion.

17. The conveyor system of claim 14 wherein the ribbon comprises:
a vertical portion adapted to support substrate carriers; and
a horizontal portion adapted to support a weight of the ribbon.

18. The conveyor system of claim 14 wherein the ribbon comprises:
a first section having:
a vertical portion adapted to support substrate carriers; and
a horizontal portion adapted to support a weight of the ribbon; and
a second section coupled to the first section and having:
a vertical portion adapted to support substrate carriers; and
a horizontal portion adapted to support a weight of the ribbon.

19. The conveyor system of claim 14 wherein the ribbon comprises stainless steel.

20. The conveyor system of claim 14 wherein the ribbon comprises a vertical portion having a first feature adapted to identify a beginning of the ribbon.

21. The conveyor system of claim 20 wherein the vertical portion of the ribbon further comprises a plurality of second features, each second feature adapted to identify a location at which a substrate carrier may be held and transported by the ribbon.

22. The conveyor system of claim 14 wherein the ribbon forms a serpentine closed loop.

23. The conveyor system of claim 14 wherein at least one housing section comprises:
a first opening adapted to allow at least one support wheel to contact and support the ribbon as the ribbon rotates; and
a second opening adapted to allow at least one constraining wheel to contact the ribbon and to reduce lateral motion of the ribbon as the ribbon rotates.

24. The conveyor system of claim 23 wherein the at least one housing section further comprises:
a third opening adapted to allow at least one driving wheel to contact the ribbon and to rotate the ribbon.

25. The conveyor system of claim 14 wherein the ribbon is adapted to transport single substrate carriers.

26. A conveyor system adapted for use in delivering substrate carriers within a semiconductor device manufacturing facility comprising:
a ribbon that forms a closed loop along at least a portion of the semiconductor device manufacturing facility, the ribbon including a vertical portion elongated in a vertical direction adapted to support substrate carriers and a horizontal portion adapted to support a weight of the ribbon;
a plurality of supports rigidly coupled to the vertical portion of the ribbon, each support adapted to support and transport a substrate carrier within the at least the portion of the semiconductor device manufacturing facility; and
at least one of a driving wheel, a constraining wheel and a support wheel adapted to contact the ribbon and to be changed while the ribbon is in motion.

27. A conveyor system adapted for use in delivering substrate carriers within a semiconductor device manufacturing facility comprising:
a ribbon that forms a closed loop along at least a portion of the semiconductor device manufacturing facility, the ribbon including a vertical portion elongated in a vertical direction adapted to support substrate carriers and a horizontal portion adapted to support a weight of the ribbon; and
a plurality of supports rigidly coupled to the vertical portion of the ribbon, each support adapted to support and transport a substrate carrier within the at least the portion of the semiconductor device manufacturing facility;
wherein the ribbon comprises:
a first section having:
a vertical portion adapted to support substrate carriers; and
a horizontal portion adapted to support a weight of the ribbon; and
a second section coupled to the first section and having:
a vertical portion adapted to support substrate carriers; and
a horizontal portion adapted to support a weight of the ribbon.

28. A conveyor system adapted for use in delivering substrate carriers within a semiconductor device manufacturing facility comprising:
a ribbon that forms a closed loop along at least a portion of the semiconductor device manufacturing facility, the ribbon including a vertical portion elongated in a vertical direction adapted to support substrate carriers and a horizontal portion adapted to support a weight of the ribbon; and
a plurality of supports rigidly coupled to the vertical portion of the ribbon, each support adapted to support and transport a substrate carrier within the at least the portion of the semiconductor device manufacturing facility;
wherein the ribbon forms a serpentine closed loop.

29. A conveyor system adapted for use in delivering substrate carriers within a semiconductor device manufacturing facility comprising:
a ribbon that forms a closed loop along at least a portion of the semiconductor device manufacturing facility, the ribbon including a vertical portion elongated in a vertical direction adapted to support substrate carriers and a horizontal portion adapted to support a weight of the ribbon;
a plurality of supports rigidly coupled to the vertical portion of the ribbon, each support adapted to support and transport a substrate carrier within the at least the portion of the semiconductor device manufacturing facility; and
a plurality of housing sections adapted to surround at least a portion of the ribbon while allowing substrate carriers to be transported by the ribbon;
wherein at least one housing section comprises:
a first opening adapted to allow at least one support wheel to contact and support the ribbon as the ribbon rotates; and
a second opening adapted to allow at least one constraining wheel to contact the ribbon and to reduce lateral motion of the ribbon as the ribbon rotates.

30. The conveyor system of claim 29 wherein the at least one housing section further comprises:
a third opening adapted to allow at least one driving wheel to contact the ribbon and to rotate the ribbon.

31. A conveyor system adapted for use in delivering substrate carriers within a semiconductor device manufacturing facility comprising:
a ribbon that forms a closed loop along at least a portion of the semiconductor device manufacturing facility, the ribbon including a vertical portion elongated in a vertical direction adapted to support substrate carriers and a horizontal portion adapted to support a weight of the ribbon;
a plurality of supports rigidly coupled to the vertical portion of the ribbon, each support adapted to support and transport a substrate carrier within the at least the portion of the semiconductor device manufacturing facility;
a plurality of housing section supports adapted to couple to and support each housing section; and
a plurality of shields adapted to couple to the plurality of housing section supports and sized to cover substrate carriers being transported by the ribbon.

* * * * *